(12) United States Patent
Fukakusa et al.

(10) Patent No.: US 10,514,158 B2
(45) Date of Patent: Dec. 24, 2019

(54) LIGHT SOURCE DEVICE AND PROJECTION DEVICE

(71) Applicant: PANASONIC INTELLECTUAL PROPERTY MANAGEMENT CO., LTD., Osaka (JP)

(72) Inventors: Masaharu Fukakusa, Osaka (JP); Hideo Yamaguchi, Fukuoka (JP); Hirotaka Ueno, Osaka (JP); Kazuhiko Yamanaka, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 3 days.

(21) Appl. No.: 15/926,613

(22) Filed: Mar. 20, 2018

(65) Prior Publication Data
US 2018/0216811 A1 Aug. 2, 2018

Related U.S. Application Data

(63) Continuation of application No. PCT/JP2016/004332, filed on Sep. 26, 2016.

(30) Foreign Application Priority Data

Sep. 29, 2015 (JP) ................................ 2015-192258

(51) Int. Cl.
*F21V 29/503* (2015.01)
*F21V 29/507* (2015.01)
(Continued)

(52) U.S. Cl.
CPC .............. *F21V 29/503* (2015.01); *F21K 9/64* (2016.08); *F21V 9/30* (2018.02); *F21V 13/08* (2013.01);
(Continued)

(58) Field of Classification Search
CPC . F21S 41/125; F21S 41/176; F21K 2099/005; F21K 9/64; F21V 13/08;
(Continued)

(56) References Cited

U.S. PATENT DOCUMENTS 5,615,052 A * 3/1997 Doggett ............... G01N 21/274
359/642
2007/0268717 A1* 11/2007 Iwasaki ................. F21V 29/004
362/539
(Continued)

FOREIGN PATENT DOCUMENTS

JP 2006-253098 A 9/2006
JP 2012-243538 A 12/2012
(Continued)

OTHER PUBLICATIONS

Extended Search Report issued in European Patent Application No. 16850649.1, dated Sep. 27, 2018.
(Continued)

*Primary Examiner* — Erin Kryukova
(74) *Attorney, Agent, or Firm* — McDermott Will & Emery LLP

(57) ABSTRACT

A light source device includes: a holder that has a first surface and a second surface located higher than the first surface, and is an integral structure; a semiconductor light-emitting device on the first surface; an optical element unit that is disposed above the semiconductor light-emitting device, and has a reflective surface that inclines with respect to the first surface and reflects emitted light from the semiconductor light-emitting device; and a phosphor optical element that is disposed on the second surface and irradiated with reflected light from the optical element unit.

18 Claims, 15 Drawing Sheets

(51) Int. Cl.
*F21V 29/70* (2015.01)
*H01S 5/00* (2006.01)
*F21V 29/502* (2015.01)
*F21V 9/30* (2018.01)
*F21K 9/64* (2016.01)
*F21V 13/08* (2006.01)
*F21K 99/00* (2016.01)

(52) U.S. Cl.
CPC .......... *F21V 29/502* (2015.01); *F21V 29/507* (2015.01); *F21V 29/70* (2015.01); *H01S 5/005* (2013.01); *F21K 2099/005* (2013.01)

(58) Field of Classification Search
CPC ........ F21V 9/30; F21V 29/502; F21V 29/503; F21V 29/507; F21V 29/70; H01S 5/002212; H01S 5/005
See application file for complete search history.

(56) References Cited

U.S. PATENT DOCUMENTS

| | | | | |
|---|---|---|---|---|
| 2007/0297179 | A1* | 12/2007 | Leung | F21V 7/0008 362/296.07 |
| 2009/0003400 | A1* | 1/2009 | Nagahama | H01L 33/483 372/50.23 |
| 2011/0013412 | A1* | 1/2011 | Kobayashi | F21S 41/645 362/538 |
| 2011/0068679 | A1* | 3/2011 | Sawamura | H01L 33/483 313/498 |
| 2011/0249460 | A1* | 10/2011 | Kushimoto | B60Q 1/085 362/510 |
| 2012/0106178 | A1* | 5/2012 | Takahashi | B60Q 1/0035 362/459 |
| 2012/0224384 | A1* | 9/2012 | Takahira | F21V 9/30 362/509 |
| 2012/0294023 | A1* | 11/2012 | Nakazato | F21S 41/125 362/510 |
| 2013/0003400 | A1* | 1/2013 | Kijima | F21S 41/14 362/517 |
| 2013/0308328 | A1 | 11/2013 | Rice et al. | |
| 2013/0314937 | A1* | 11/2013 | Takahashi | F21S 41/16 362/538 |
| 2014/0160782 | A1* | 6/2014 | Harada | F21V 5/008 362/538 |
| 2015/0062943 | A1* | 3/2015 | Takahira | F21S 41/675 362/510 |
| 2015/0308644 | A1 | 10/2015 | Takahashi et al. | |
| 2017/0067619 | A1* | 3/2017 | Son | G02B 27/283 |

FOREIGN PATENT DOCUMENTS

| | | |
|---|---|---|
| JP | 2013-243130 A | 12/2013 |
| JP | 2013-246943 A | 12/2013 |
| JP | 2014-10917 A | 1/2014 |
| JP | 2015-065144 A | 4/2015 |
| WO | 2007/105647 A1 | 9/2007 |
| WO | 2009/131126 A1 | 10/2009 |

OTHER PUBLICATIONS

International Search Report and Written Opinion issued in International Patent Application No. PCT/JP2016/004332, dated Dec. 27, 2016; with partial English translation.

* cited by examiner

LIGHT SOURCE DEVICE AND PROJECTION DEVICE

CROSS REFERENCE TO RELATED APPLICATIONS

This application is a U.S. continuation application of PCT International Patent Application Number PCT/JP2016/004332 filed on Sep. 26, 2016, claiming the benefit of priority of Japanese Patent Application Number 2015-192258 filed on Sep. 29, 2015, the entire contents of which are hereby incorporated by reference.

BACKGROUND

1. Technical Field

The present disclosure relates to a light source device and a projection device, and particularly to a light source device which uses light radiated as a result of irradiation of a wavelength conversion element with light emitted from a semiconductor light-emitting device and is used in the field of displays including a projection display device or in the field of lighting including vehicular lighting and medical lighting, and to a projection device including said light source device.

2. Description of the Related Art

In order to radiate light with a high luminous flux, a projection device using a semiconductor light-emitting device including a semiconductor light-emitting element such as a semiconductor laser is required to converge light radiated from the semiconductor light-emitting device onto a wavelength conversion element and efficiently use the radiated light by the wavelength conversion element. The conventional projection device disclosed in Japanese Unexamined Patent Application Publication No. 2012-243538 will be described below with reference to FIG. 16.

FIG. 16 illustrates a configuration of conventional projection device 1001 and an optical path of light radiated from semiconductor light-emitting device 1011.

In projection device 1001, when semiconductor light-emitting device 1011 is turned ON, as illustrated in FIG. 16, blue light (blue laser light) $L_B$ emitted from semiconductor light-emitting device 1011 is reflected off reflective surface 1131 of mirror 1013 while being converged by collecting lens 1012, and travels obliquely downward and enters, from the front, a surface of phosphor 1014 which emits yellow light. Most of blue light $L_B$ incident on phosphor 1014 is converted into white light by being mixed with the yellow light emitted by phosphor 1014, is emitted upward in a radial pattern, and strikes reflector 1015. This white light is reflected off reflective surface 1151 of reflector 1015 forward and is emitted forward from projection lens 1017. In projection device 1001, phosphor 1014 is attached to metal plate 1018 having heat-dissipating fins 1181 formed thereon.

International Publication No. 2007/105647 proposes a light-emitting device using fluorescent glass. In the light-emitting device disclosed in International Publication No. 2007/105647, a semiconductor light-emitting element is mounted on a support body including lead terminals such that light is emitted upwardly above the support body, and the fluorescent glass is arranged on both left and right sides or in the surrounding area of the semiconductor light-emitting element. Furthermore, a glass plate is held at the distal end of a reflector provided around the fluorescent glass, and a reflection film is formed on part of the inner surface or the entire inner surface of the glass plate. As a result of this, the light from the semiconductor light-emitting element is reflected off the inner surface of the glass plate located above the semiconductor light-emitting element, and the reflected light enters the fluorescent glass and excites a phosphor, and the light emitted from the phosphor passes through the glass plate and is emitted upwardly above the support body, directly or after being reflected off the inner surface of the reflector.

SUMMARY

However, the conventional light source device (for example, Japanese Unexamined Patent Application Publication No. 2012-243538) uses the fixing plate for each of the semiconductor light-emitting device and the phosphor.

Therefore, it is problematic that a large number of components are required and the optical axis easily shifts due to changes in external environment such as vibration when in use, for example, in the case where the light source device is mounted on a vehicle, resulting in shifting of the optical path through which the emitted light from the semiconductor light-emitting device is guided to the phosphor.

Furthermore, in the case of exhausting the heat generated at the semiconductor light-emitting device and the phosphor to the outside, heat dissipation paths are long and complex; thus, there is the problem of complex product design and insufficient heat dissipation performance.

Moreover, in the light-emitting device disclosed in International Publication No. 2007/105647, since part of the light from the phosphor is reflected off the inner surface of the reflector before being extracted out of the light-emitting device, it is problematic that the light extraction efficiency is reduced upon the reflection, and in addition, the position of effective light emission shifts upon the reflection of the light, causing the problem of insufficient luminance improvement.

The present disclosure is conceived to solve the aforementioned problems and has as an object to provide a light source device in which the occurrence of an optical path through which the emitted light from a semiconductor light-emitting device is guided to a phosphor optical element shifting due to changes in external environment is reduced and which is capable of efficiently exhausting the heat generated at the semiconductor light-emitting device and the phosphor optical element and from which light can be efficiently extracted.

In order to solve the aforementioned problems, the light source device according to an aspect of the present disclosure includes: a holder having a first surface and a second surface and being an integral structure, the second surface being located higher than the first surface; a semiconductor light-emitting device on the first surface; a reflective optical element above the semiconductor light-emitting device, the reflective optical element having a reflective surface that inclines with respect to the first surface and reflects emitted light from the semiconductor light-emitting device; and a phosphor optical element on the second surface, the phosphor optical element being irradiated with reflected light from the reflective optical element.

With this configuration, it is possible to reduce the occurrence of the optical path through which the emitted light from the semiconductor light-emitting device is guided to the phosphor optical element shifting due to changes in external environment. Furthermore, it is also possible to efficiently exhaust the heat generated at the semiconductor light-emitting device and the phosphor optical element.

Moreover, it is also possible to efficiently extract the light out of the light source device.

Furthermore, in the light source device according to an aspect of the present disclosure, a surface of the holder opposite the first surface may be a first heat-dissipating surface that dissipates heat generated at the semiconductor light-emitting device, and a surface of the holder opposite the second surface may be a second heat-dissipating surface that dissipates heat generated at the phosphor optical element.

With this configuration, the heat generated in the semiconductor light-emitting device and the phosphor optical element can be more efficiently exhausted.

Furthermore, in the light source device according to an aspect of the present disclosure, the first heat-dissipating surface and the second heat-dissipating surface may be flush.

With this configuration, the heat generated in the semiconductor light-emitting device and the phosphor optical element can be still more efficiently exhausted.

Furthermore, in the light source device according to an aspect of the present disclosure, the holder may be an integral heat dissipator. In this case, the holder may include a metal.

With this configuration, the heat generated in the semiconductor light-emitting device and the phosphor optical element can be still more efficiently exhausted.

Furthermore, in the light source device according to an aspect of the present disclosure, the semiconductor light-emitting device may include: a base thermally connected to the first surface of the holder; a semiconductor light-emitting element that is thermally connected to the base and radiates the emitted light; and a cap on the base, the cap including a light-transmissive member that transmits the emitted light, and a sealed space may be defined inside the semiconductor light-emitting device. In this case, the light-transmissive member may be sheet glass or a lens.

With this configuration, since the semiconductor light-emitting element included in the semiconductor light-emitting device is sealed off, it is possible to inhibit a reduction in the efficiency of the semiconductor light-emitting element by collecting exterior trash and dust through optical tweezing using the emitted light having high light density.

Furthermore, in the light source device according to an aspect of the present disclosure, the reflective optical element may include: a holding member on a third surface of the holder, the holding member being opaque; and a reflector element having the reflective surface and fixed to a surface of the holding member that faces the semiconductor light-emitting device.

With this configuration, even when the reflective surface of the reflective optical element breaks, for example, direct radiation of the emitted light from the light source device can be suppressed.

Furthermore, in the light source device according to an aspect of the present disclosure, the reflective surface may be shaped to converge the reflected light.

With this configuration, it is possible to cause the light reflected off the reflective surface to enter the phosphor optical element without using a collecting lens between the reflective optical element and the phosphor optical element.

Furthermore, in the light source device according to an aspect of the present disclosure, the holder may include a pinching portion that pinches a part of the holding member, and the holding member may be movable parallel to the third surface.

With this configuration, since an optical element unit can be moved horizontally with respect to the third surface, it is possible to finely adjust the position of the reflective optical element. Therefore, it is possible to cause the light reflected by the reflective optical element to enter the phosphor optical element in a desired position, and thus the conversion efficiency at the phosphor optical element can be improved. Furthermore, even when the fixing member (such as a screw) for fixing the optical reflector element is detached, the optical reflector element can be inhibited from falling off, and thus it is possible to reduce the occurrence of the emitted light from the semiconductor light-emitting device being directly radiated to the outside of the light source device due to the optical reflector element having fallen off.

Furthermore, the light source device according to an aspect of the present disclosure may further include a light-transmissive cover above the phosphor optical element, and the semiconductor light-emitting device and the phosphor optical element may be disposed in a closed space surrounded by the holder, the holding member, and the light-transmissive cover.

With this configuration, it is possible to inhibit a reduction in the efficiency of the optical component by collecting exterior trash and dust through optical tweezing using the emitted light having high light density.

Furthermore, in the light source device according to an aspect of the present disclosure, a surface of the light-transmissive cover that faces the phosphor optical element may incline with respect to a fluorescent surface of the phosphor optical element.

With this configuration, the phosphor optical element is located higher than the semiconductor light-emitting device and furthermore, the light-emitter of the phosphor optical element can be brought close to the exterior of the light source device, allowing the light radiated omnidirectionally from the phosphor optical element to be efficiently radiated outward.

Furthermore, the light source device according to an aspect of the present disclosure may further include a lens between the reflective optical element and the semiconductor light-emitting device.

With this configuration, the light emitted from the semiconductor light-emitting device can be efficiently converged onto the phosphor optical element, and thus a high luminance light source can be provided.

Furthermore, in the light source device according to an aspect of the present disclosure, the holder may include a recess, and the first surface may be a bottom surface of the recess.

With this configuration, the region in which the semiconductor light-emitting device is disposed is limited to the recess, and thus the semiconductor light-emitting device can be easily disposed in a predetermined position on the first surface.

Furthermore, the projection device according to an aspect of the present disclosure includes a light source device according to one of the above aspects.

With this configuration, a projection device with superior heat dissipation properties can be provided.

Furthermore, the projection device according to an aspect of the present disclosure may further include a reflector that reflects light emitted from the light source device. In this case, the projection device may further include a damper that absorbs or diffuses light emitted from the light source device that fails to strike the reflector.

With this configuration, it is possible to inhibit unnecessary light that fails to strike the reflector from being emitted to the outside.

Furthermore, in the projection device according to an aspect of the present disclosure, the light reflected by the reflector may travel across an extension of an optical path through which the emitted light travels from the semiconductor light-emitting device to the reflective optical element.

With this configuration, the light reflected by the reflector travels in a direction opposite to that of the reflected light traveling from the reflective optical element, i.e., the optical element unit, toward the phosphor optical element. Accordingly, the reflected light traveling from the reflective optical element, i.e., the optical element unit, toward the phosphor optical element, which is highly directional and propagates with high power density, is not reflected by the reflector; thus, it is possible to inhibit such reflected light from being emitted directly out of the projection device. In other words, with this configuration, it is possible to inhibit the light propagating with high power density, which is used in the light source device included in the projection device, from being radiated directly out of the projection device.

According to the present disclosure, the occurrence of an optical path through which the emitted light from a semiconductor light-emitting device is guided to a phosphor optical element shifting due to changes in external environment is reduced, and it is possible to efficiently exhaust the heat generated at the semiconductor light-emitting device and the phosphor optical element, and efficiently extract light out of the light source device.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Hereinafter, embodiments of the present disclosure will be described in detail with reference to the drawings. Note that each of the embodiments described below shows a specific preferred example of the present disclosure. Thus, the numerical values, structural elements, and the arrangement and connection of the structural elements, steps, the processing order of the steps, etc., shown in the following embodiments are mere examples, and are not intended to limit the present disclosure. Accordingly, among the structural elements in the following embodiments, structural elements not recited in an independent claim indicating the broadest concept of the present disclosure are described as arbitrary structural elements.

Embodiment 1

[Light Source Device]

Figure 1:
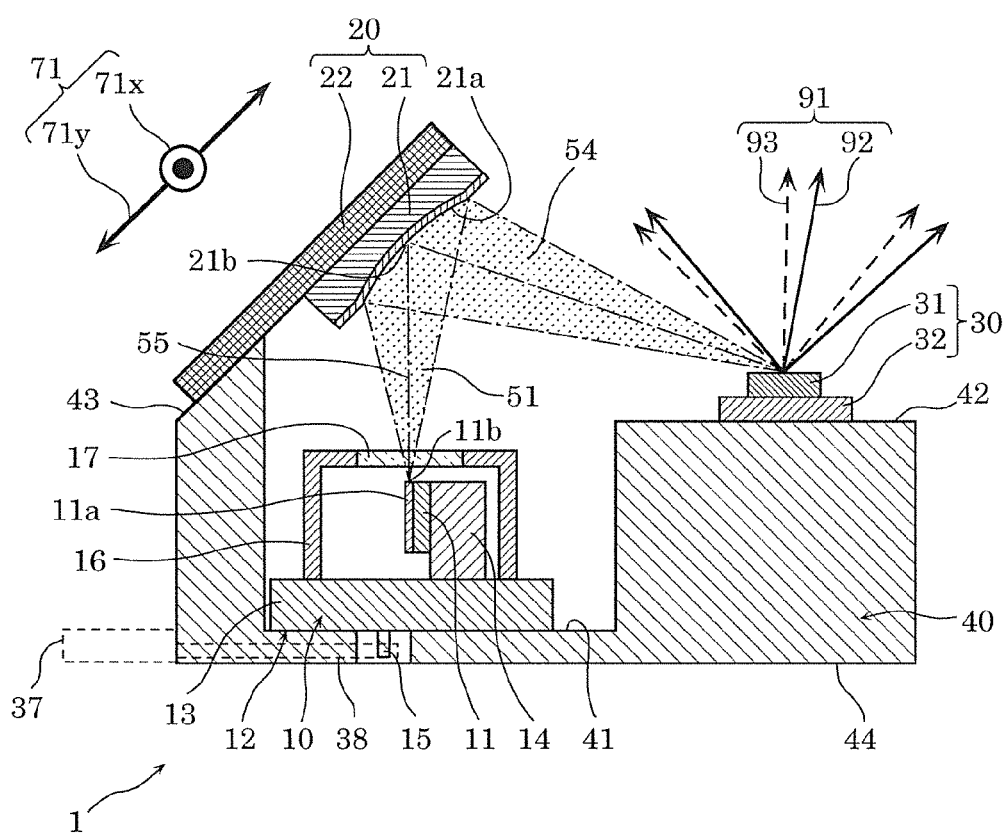
FIG. 1 is a schematic cross-sectional view illustrating a configuration of a light source device according to Embodiment 1 of the present disclosure.
Figure 2:
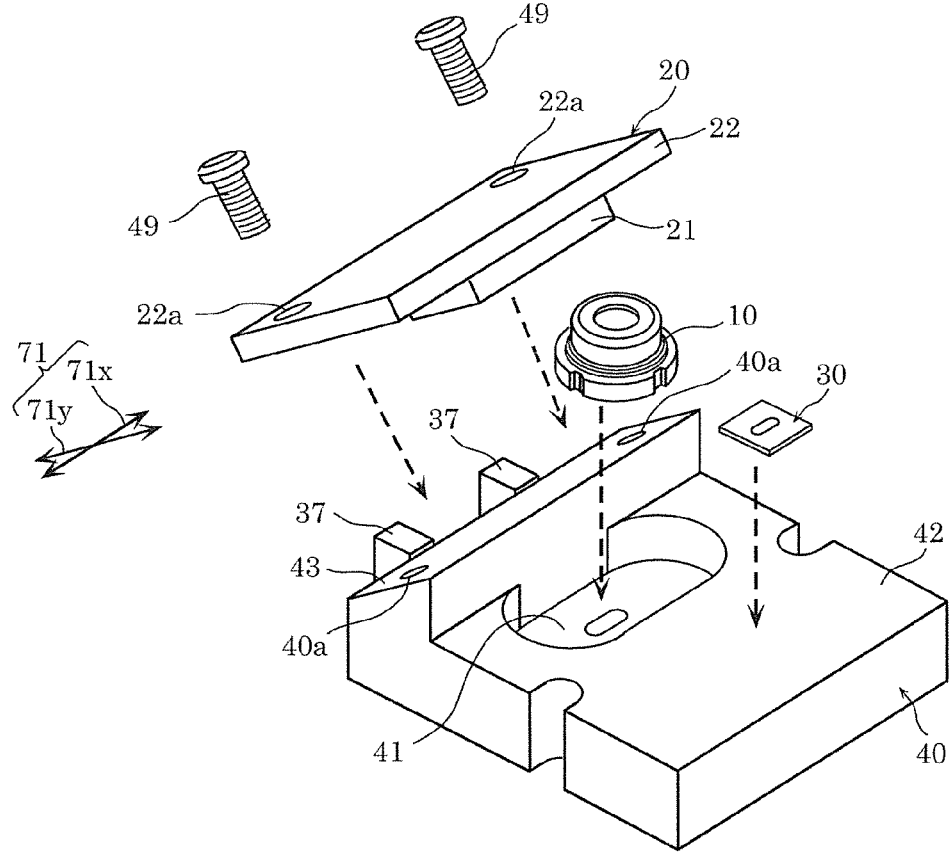
FIG. 2 is an exploded view of a light source device according to Embodiment 1 of the present disclosure.
Figure 3:
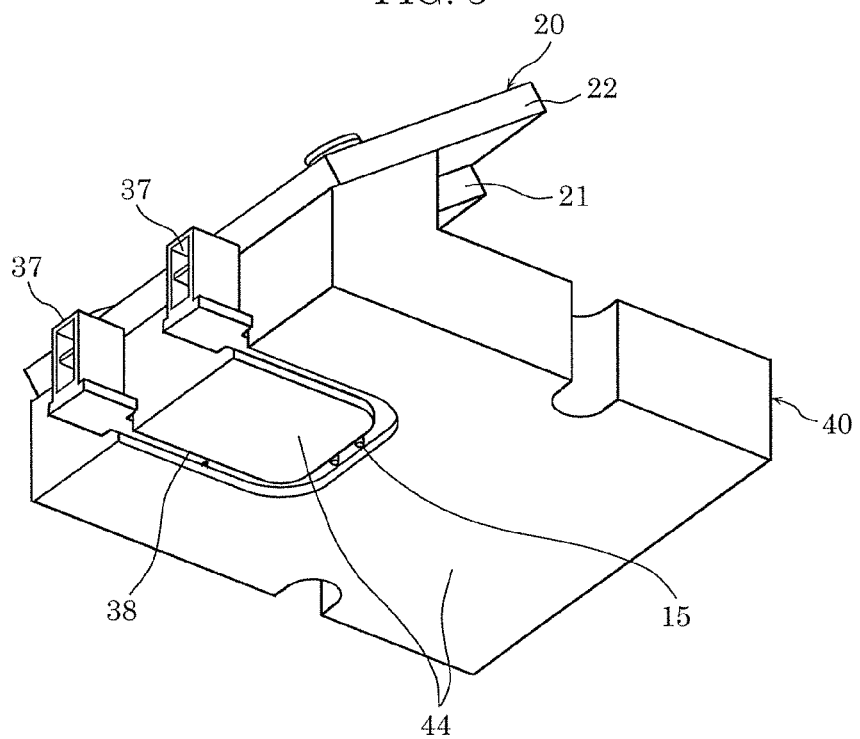
FIG. 3 is a perspective view of a light source device according to Embodiment 1 of the present disclosure as viewed from the back surface thereof.

Hereinafter, a light source device according to Embodiment 1 of the present disclosure will be described with reference to FIG. 1 to FIG. 3. FIG. 1 is a schematic cross-sectional view illustrating a configuration of light source device 1 according to Embodiment 1 of the present disclosure. FIG. 2 is an exploded view of light source device 1. FIG. 3 is a schematic cross-sectional view for describing the functions of light source device 1.

Configuration

Light source device 1 according to Embodiment 1 of the present disclosure includes semiconductor light-emitting device 10, optical element unit 20, phosphor optical element 30, and holder 40, as illustrated in FIG. 1 to FIG. 3. Light source device 1 is configured such that semiconductor light-emitting device 10 and phosphor optical element 30 are fixed to holder 40 and furthermore, optical element unit 20 is fixed to holder 40.

Semiconductor light-emitting device 10 includes: semiconductor light-emitting element 11 having optical waveguide 11a; and package 12 for mounting semiconductor light-emitting element 11. The interior space of semiconductor light-emitting device 10 is a sealed space having airtightness maintained at a high level such that semiconductor light-emitting element 11 is shielded from the outside environment. Semiconductor light-emitting element 11 is a semiconductor laser element (for example, a laser chip) including a nitride semiconductor, for example, and radiates, as emitted light 51, laser light having a peak wavelength between wavelengths of 380 nm and 490 nm.

Package 12 is, for example, what is called a CAN package, and includes: base 13 in the shape of a disc; post 14 for mounting semiconductor light-emitting element 11 on base 13 directly or via a submount (not illustrated in the drawings); lead pin 15 for supplying power to semiconductor light-emitting element 11 from the outside; and cap (can) 16 made of metal disposed on base 13. Windowpane 17 is attached to cap 16 in order to seal off semiconductor light-emitting element 11. Windowpane 17 is one example of a light-transmitting member which transmits emitted light 51 output from semiconductor light-emitting element 11, and in the present embodiment, is sheet glass. Semiconductor light-emitting element 11 is disposed in the sealed space enclosed by base 13 and cap 16. Furthermore, semiconductor light-emitting element 11 is thermally and physically connected to base 13 by being mounted on base 13.

Semiconductor light-emitting device 10 configured in this manner is disposed on first surface 41 of holder 40. Specifically, semiconductor light-emitting device 10 is mounted on holder 40 so that a surface of base 13 opposite a surface thereof on which semiconductor light-emitting element 11 and post 14 are disposed contacts first surface 41 of holder 40. Thus, semiconductor light-emitting device 10 (base 13) is thermally or physically connected to first surface 41 of holder 40.

As illustrated in FIG. 1 and FIG. 2, the surrounding of first surface 41 may be enclosed by a section greater in height than first surface 41 (above first surface 41 in the figures). In other words, the bottom surface of a recess provided in a part of holder 40 may be used as first surface 41. With this configuration, the region in which semiconductor light-emitting device 10 is disposed is limited to the recess, and thus semiconductor light-emitting device 10 can be easily disposed in a predetermined position on first surface 41.

Optical element unit 20 includes optical element 21 and optical element holding member 22. Optical element 21 is a reflector element having reflective surface 21a. In other words, in the present embodiment, optical element unit 20 is a reflective optical element (reflector element unit).

Optical element 21 reflects emitted light 51 from semiconductor light-emitting device 10 by reflective surface 21a. Reflected light 54 which is the light reflected off reflective surface 21a travels toward phosphor optical element 30. Reflective surface 21a inclines with respect to first surface 41 and second surface 42 of holder 40. In other words, a plane including reflective surface 21a and a plane including first surface 41 (second surface 42) intersect each other.

In the present embodiment, optical element 21 is obtained by forming, on a surface of a recess formed in part of a surface of sheet glass, for example, a reflective film including one or both of a dielectric multi-layer film and a metal film, for example. A surface of this reflective film is reflective surface 21a. Since the recess is formed in optical element 21 as just mentioned, reflective surface 21a is a curved surface corresponding to the shape of the recess. Specifically, reflective surface 21a includes a lens shaped in such a way as to converge reflected light 54, and the focus of this lens is on phosphor optical element 30 (phosphor 31). With this, reflected light 54 which is the light reflected off reflective surface 21a can be converged onto phosphor optical element 30 (phosphor 31).

Optical element holding member 22 is a holding member that holds optical element 21. In the present embodiment, optical element 21 is fixed on a surface of optical element holding member 22 that faces semiconductor light-emitting device 10. Specifically, optical element 21 is bonded to optical element holding member 22. Furthermore, optical element holding member 22 is disposed on third surface 43 of holder 40. Optical element holding member 22 is made of a material that is opaque for emitted light 51 such as an aluminum alloy.

Optical element unit 20 is attached to holder 40 in such a way as to be located above semiconductor light-emitting device 10. Specifically, optical element unit 20 is fixed to holder 40 by optical element holding member 22 being screwed into holder 40 with screw 49 (refer to FIG. 2) in the state of being pressed against third surface 43 of holder 40.

At this time, optical element unit 20 is adjusted so that, in the plane of third surface 43, principal point 21b of optical element 21 substantially matches optical axis 55 of emitted light 51 from semiconductor light-emitting device 10 in directions 71x and 71y which are the directions of two axes parallel to third surface 43 and serving as optical element unit adjustment direction 71, as illustrated in FIG. 1.

As illustrated in FIG. 2, optical element holding member 22 has opening 22a in a part of a plate-shaped substrate. Optical element holding member 22 is fixed to holder 40 by screw 49 inserted into opening 22a being screwed into screw hole 40a of holder 40 after the abovementioned adjustment.

Phosphor optical element 30 includes phosphor 31 and phosphor holding member 32 that holds phosphor 31. Phosphor 31 is provided, for example, on phosphor holding member 32. Phosphor optical element 30 is one example of a wavelength conversion element that converts the wavelength of incident light, and in the present embodiment, includes phosphor 31 as a wavelength converting material that converts the wavelength of incident light.

Phosphor 31 emits light by fluorescence using incident light as excitation light. Phosphor 31 includes, for example, a cerium-activated yttrium aluminum garnet (YAG:Ce$^{3+}$)-based phosphor material. As phosphor 31, a layered stack including a mixture of phosphor particles of YAG:Ce$^{3+}$ and the like dispersed in a transparent resin (binder) such as glass or silicone may be used, for example, and a ceramic phosphor plate formed by sintering a mixture of phosphor particles of YAG:Ce$^{3+}$ and the like and alumina (Al$_2$O$_3$), etc., may be used, for example. Note that phosphor 31 is not limited to the YAG-based material. Phosphor holding member 32 is a ceramic body including aluminum nitride, for example. Although not illustrated in the drawings, a reflective film made of a silver alloy, for example, may be formed between phosphor holding member 32 and phosphor 31.

Phosphor optical element 30 configured in this manner is disposed on second surface 42 of holder 40. Specifically, phosphor optical element 30 is fixed to holder 40 in such a way that the phosphor holding member 32-*side* thereof contacts second surface 42. Thus, phosphor optical element 30 (phosphor holding member 32) is thermally and physically connected to second surface 42 of holder 40.

Furthermore, phosphor optical element 30 is irradiated with reflected light 54 from optical element unit 20 (reflector element). Specifically, phosphor 31 is irradiated with reflected light 54 from optical element unit 20. Thus, phosphor 31 is excited by reflected light 54 and thereby generates fluorescence.

Holder 40 is a holding member that holds semiconductor light-emitting device 10 and phosphor optical element 30. In the present embodiment, holder 40 holds optical element unit 20 as well. Holder 40 is an integral structure. In order that holder 40 is an integral structure, it is sufficient herein that holder 40 be integrally formed before semiconductor light-emitting device 10 and phosphor optical element 30 are disposed thereon; it includes not only an integral structure integrally formed by casting, forging, cutting, etc., but also an integral structure formed by joining two or more components together by welding, bonding, or the like. For example, holder 40 formed by welding a component made of copper and a component made of an aluminum alloy is an integral structure. Note that examples of the integral structure do not include elements that can be easily separated after semiconductor light-emitting device 10 and phosphor optical element 30 are disposed (for example, screws).

In the present embodiment, holder 40 is an integral heat dissipator, and includes a metal such as an aluminum alloy or copper, for example.

Holder 40 has first surface 41 and second surface 42 located higher than first surface 41. First surface 41 is a surface to which semiconductor light-emitting device 10 is attached, and second surface 42 is a surface to which phosphor optical element 30 is attached. In the present embodiment, holder 40 further has third surface 43 to which optical element unit 20 is attached. As illustrated in FIG. 2, first surface 41 is formed by indenting part of second surface 42 so that a recess is formed; a step is formed between first surface 41 and second surface 42. Therefore, semiconductor light-emitting device 10 placed on first surface 41 and phosphor optical element 30 placed on second surface 42 are arranged side by side at different heights. Note that each of first surface 41, second surface 42, and third surface 43 is flat.

Furthermore, as illustrated in FIG. 1, holder 40 has fourth surface 44. Fourth surface 44 functions as a heat-dissipating surface for allowing the Joule heat generated at semiconductor light-emitting device 10 and phosphor optical element 30 to be exhausted to an external heat sink, etc. Fourth surface 44 may be flat.

Part of fourth surface 44 on the opposite side from first surface 41 is a first heat-dissipating surface that dissipates the heat generated at semiconductor light-emitting device 10. Part of fourth surface 44 on the opposite side from second surface 42 is a second heat-dissipating surface that dissipates the heat generated at phosphor optical element 30. In the present embodiment, since the entirety of fourth surface 44 is flat, first heat-dissipating surface and second heat-dissipating surface are the same flat surface.

First surface 41 and second surface 42 of holder 40 are formed in such a way as to be located on the same side of holder 40. Furthermore, first surface 41 and second surface 42 are formed in such a way as to be located at different heights with respect to fourth surface 44 (heat-dissipating surface). Preferably, second surface 42 may be located farther from fourth surface 44 than first surface 41 is; in other words, the thickness of holder 40 between fourth surface 44 and second surface 42 may be greater than the thickness of holder 40 between fourth surface 44 and first surface 41. In the present embodiment, first surface 41, second surface 42, and fourth surface 44 are parallel to one another.

On the fourth surface 44-side of holder 40, wire 38 that is joined by soldering, etc., and connector 37 for supplying power from the outside are provided on lead pin 15 of semiconductor light-emitting device 10. Lead pin 15, wire 38, and connector 37 are provided in a groove formed in fourth surface 44 so as to be located inward (in an inner area) of fourth surface 44.

Functions

Figure 4:
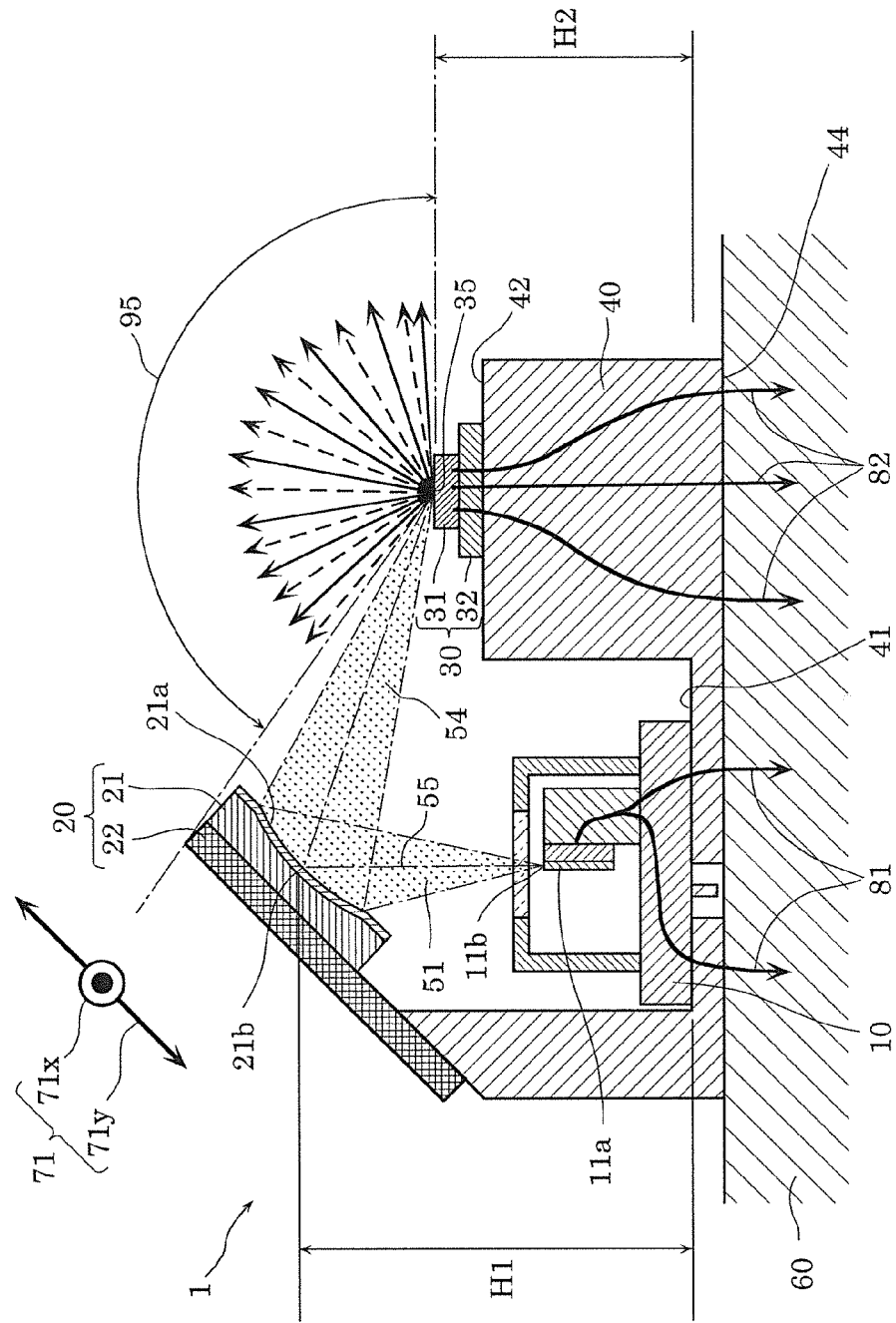
FIG. 4 is a schematic cross-sectional view for describing the operations and functions of a light source device according to Embodiment 1 of the present disclosure.

Next, the operations and functions of light source device 1 according to the present embodiment will be described using FIG. 4 with reference to FIG. 1. FIG. 4 is a schematic cross-sectional view for describing the operations and functions of light source device 1 according to Embodiment 1 of the present disclosure. In FIG. 4, the illustration of connector 37 and wire 38 is omitted.

In the case of operating light source device 1, power is supplied from the outside to connector 37 illustrated in FIG. 1, and the power is supplied to optical waveguide 11a of semiconductor light-emitting element 11 in semiconductor light-emitting device 10 via wire 38 and lead pin 15.

The power supplied to optical waveguide 11a of semiconductor light-emitting element 11 is converted into laser light (blue light) having a wavelength of 450 nm, for example, and the laser light is radiated as emitted light 51 from end surface 11b which is a microscopic region at an end portion of optical waveguide 11a. At this time, emitted light 51 is output from semiconductor light-emitting device 10 in a direction perpendicular to first surface 41 (fourth surface 44) of holder 40.

As illustrated in FIG. 4, emitted light 51 radiated from semiconductor light-emitting device 10 is reflected off reflective surface 21a of optical element 21 disposed above semiconductor light-emitting device 10. In the present embodiment, since reflective surface 21a has a light-converging lens function, emitted light 51 is reflected off reflective surface 21a and output from optical element 21 as reflected light (converged light) 54 which is converged.

Since reflective surface 21a inclines with respect to first surface 41, reflected light 54 which is the light reflected off reflective surface 21a travels obliquely downward and irradiates phosphor 31 of phosphor optical element 30 disposed on the same holder 40 on which semiconductor light-emitting device 10 is disposed. At this time, part of reflected light 54 converged onto light-emitting point 35 which is a microscopic region on phosphor 31 is converted by phosphor 31 into fluorescence 93, and another part of reflected light 54 is scattered by phosphor 31 and radiated, as scattered light 92, from light-emitting point 35 which is the microscopic region on phosphor 31. In this case, when a phosphor material (for example, a yellow phosphor material) that absorbs light having a wavelength between 420 nm and 480 nm (for example, blue light) and emits fluorescence radiation having a wavelength between 500 nm and 630 nm is used as a phosphor material of phosphor 31, white light obtained by combining fluorescence 93 and scattered light 92 can be radiated from phosphor 31 as radiated light 91.

In light source device 1 which operates as described above, semiconductor light-emitting device 10 emits part of supplied power as light while causing semiconductor light-emitting element 11 to generate Joule heat with the remaining power. Furthermore, also in phosphor optical element 30, out of the emitted light (reflected light 54), light (energy) that has not been turned into fluorescence 93 or scattered light 92 is turned into Joule heat, causing heat generation of phosphor 31.

The heat generated at semiconductor light-emitting element 11 in semiconductor light-emitting device 10 is transmitted by post 14 and base 13 of package 12 and released to the outside of semiconductor light-emitting device 10. Furthermore, the heat generated at phosphor 31 of phosphor optical element 30 is released to the outside through phosphor holding member 32 of phosphor optical element 30.

As described above, in light source device 1, emitted light 51 is radiated upward from semiconductor light-emitting device 10; light source device 1 is designed so that an optical path through which emitted light 51 from semiconductor light-emitting device 10 is guided to phosphor optical element 30 and an optical path through which radiated light 91 output from phosphor optical element 30 is guided to the outside of light source device 1 are located above holder 40.

On the other hand, light source device 1 is designed so that the heat generated at semiconductor light-emitting element 11 in semiconductor light-emitting device 10 and the heat generated at phosphor 31 in phosphor optical element 30 are transmitted below holder 40.

In other words, light source device 1 is configured so that the optical path and the heat-dissipating path are separated, specifically, the optical path and the heat-dissipating path are vertically separated across holder 40.

In light source device 1 according to the present embodiment, first surface 41 on which semiconductor light-emitting device 10 is disposed and second surface 42 on which phosphor optical element 30 is disposed are opposite to fourth surface 44 which is the heat-dissipating surface and furthermore, are arranged side by side at different heights.

Accordingly, as indicated by first heat-dissipating path 81 and second heat-dissipating path 82 in FIG. 4, the heat generated at semiconductor light-emitting device 10 and phosphor optical element 30 can be quickly exhausted to external heat dissipator 60 through a short heat-dissipating path from first surface 41 and second surface 42 to fourth surface 44. Thus, it is possible to inhibit a reduction in the efficiency of light conversion of emitted light 51 and fluorescence 93 that is due to an increase in the temperature of semiconductor light-emitting element 11 and phosphor 31.

Furthermore, since semiconductor light-emitting device 10, which radiates light from the microscopic region, and phosphor optical element 30, which radiates light, namely, radiated light 91, from the microscopic region, are disposed on the same holder 40, the relative positions of semiconductor light-emitting device 10 and phosphor optical element 30 on holder 40 are not likely to shift even when the external environment such as an environmental temperature changes. For example, optical axis 55 is not likely to shift even when the external environment changes. Thus, it is possible to reduce the occurrence of the optical path through which emitted light 51 from semiconductor light-emitting device 10 is guided to phosphor optical element 30 shifting due to changes in external environment, and moreover the heat generated at semiconductor light-emitting device 10 and phosphor optical element 30 can be exhausted with increased efficiency.

Furthermore, in the present embodiment, radiated light 91 which is the light radiated from phosphor 31 can be efficiently extracted out of light source device 1 and be used. For example, as illustrated in FIG. 4, radiated light 91 which is the light radiated from phosphor 31 travels omnidirectionally above phosphor 31. At this time, when phosphor optical element 30 is disposed in such a way that the position of light-emitting point 35 of phosphor 31 is located slightly below principal point 21b of optical element 21 (reflective surface 21a), radiation range 95 of radiated light 91 which is the light radiated from phosphor 31 can be widened. Specifically, as illustrated in FIG. 4, when the difference between the height (H1) from first surface 41 to principal point 21b of optical element 21 and the height (H2) from first surface 41 to light-emitting point 35 of phosphor 31 is reduced, radiation range 95 of radiated light 91 which is the light radiated from phosphor 31 can be widened. Thus, radiated light 91 which is the light radiated from phosphor 31 can be efficiently used by an optical system (not illustrated in the drawings) disposed downstream of light source device 1. Note that the height (H1) from first surface 41 to principal point 21b of optical element 21 is greater than the height (H2) from first surface 41 to light-emitting point 35 of phosphor 31 (H1>H2).

In this case, light-emitting point 35 may be present between principal point 21b and first surface 41, to which semiconductor light-emitting device 10 is attached, relative to fourth surface 44. This allows semiconductor light-emitting device 10 which generates a greater amount of heat than phosphor optical element 30 to approach fourth surface 44 which is a heat-dissipating surface. Thus, it is possible to not only widen radiation range 95 of radiated light 91 which is the light radiated from phosphor 31, but also quickly exhaust the heat generated at semiconductor light-emitting device 10 and phosphor optical element 30.

Furthermore, in the present embodiment, radiated light 91 from phosphor 31 is not reflected by a reflective member and is extracted out of light source device 1. This prevents the light extraction efficiency from being reduced by the reflective member and in addition, prevents the effective position of the light-emitting point from shifting upon reflection on the reflective member. Thus, it is possible to inhibit a reduction in luminance and sufficiently improve the luminance.

As described above, with light source device 1 according to the present embodiment, it is possible to reduce the occurrence of the optical path through which emitted light 51 from semiconductor light-emitting device 10 is guided to phosphor optical element 30 shifting due to changes in external environment, and it is possible to efficiently exhaust the heat generated at semiconductor light-emitting device 10 and phosphor optical element 30, and efficiently extract light out of light source device 1.

[Projection Device]

Figure 5:
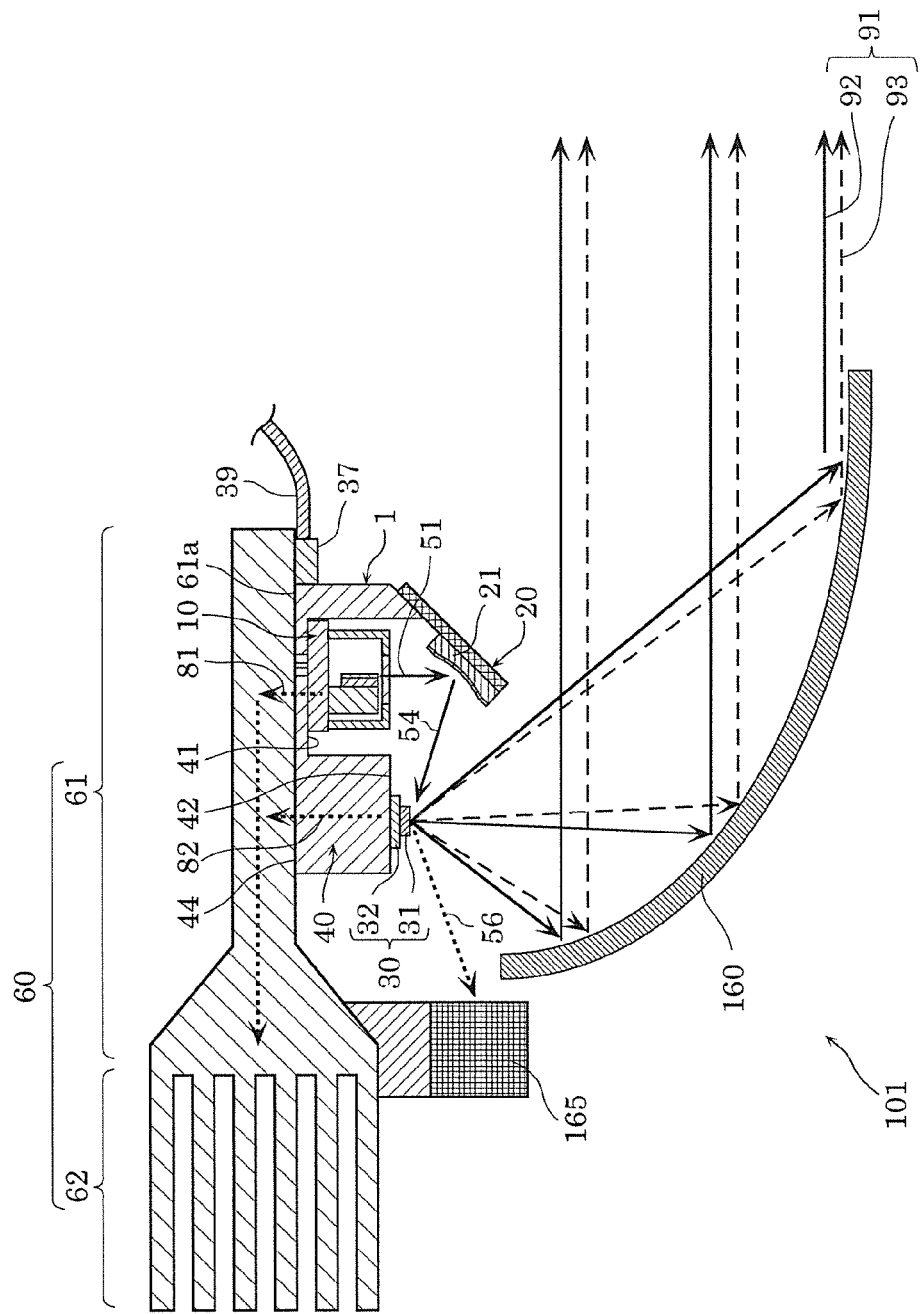
FIG. 5 is a schematic cross-sectional view illustrating a configuration of a projection device according to Embodiment 1 of the present disclosure.

Next, projection device 101 including light source device 1 according to Embodiment 1 of the present disclosure will be described with reference to FIG. 5. FIG. 5 is a schematic cross-sectional view illustrating a configuration of projection device 101 according to Embodiment 1 of the present disclosure. Projection device 101 is, for example, a lamp device for vehicle headlight use.

As illustrated in FIG. 5, projection device 101 includes heat dissipator 60, light source device 1 attached to heat dissipator 60, and reflector 160 which reflects light emitted from light source device 1. In other words, light source device 1 is used as a light source in projection device 101. In the present embodiment, projection device 101 further includes damper 165 which absorbs light emitted from light source device 1 that fails to strike reflector 160.

Light source device 1 is attached to heat dissipator 60. Heat dissipator 60 includes: base plate 61 for transmitting the heat generated at light source device 1 to heat-dissipating fin 62; and heat-dissipating fin 62 for dissipating the heat generated at light source device 1 into the ambient air.

Light source device 1 is attached to attachment portion 61a of base plate 61. The attachment surface of attachment portion 61a is flat, for example. Light source device 1 is fixed to attachment portion 61a, for example, with a screw (not illustrated in the drawings). At this time, light source device 1 is disposed on base plate 61 in such a way that fourth surface 44 of holder 40 and attachment portion 61a are in surface contact with each other. Furthermore, power supply cable 39 through which power is supplied to light source device 1 in order to turn ON projection device 101 is connected to connector 37 of light source device 1.

Reflector 160 is a reflective member for changing the angle of radiation of radiated light 91 from light source device 1 to project radiated light 91 forward, and is disposed in such a way that a reflective surface thereof faces light source device 1. Specifically, reflector 160 is, for example, a curved mirror such as a parabolic mirror, and is disposed in such a way that the focus of reflector 160 substantially matches light-emitting point 35 of phosphor optical element 30 (phosphor 31). The light emitted from phosphor optical element 30 is reflected by reflector 160 so as to become substantially parallel light and then is radiated to the outside of projection device 101.

Furthermore, in the present embodiment, damper 165 includes, for example, a black alumite-finished aluminum alloy having a textured surface, and is provided rearward of phosphor optical element 30 when viewed from light source device 1. With this configuration, even when reflected light 56 is produced which is reflected light 54 incident on phosphor optical element 30 that is not sufficiently scattered and is reflected by phosphor optical element 30, such reflected light 56 is emitted to damper 165 and thus prevented from being radiated to the outside. In other words, the present embodiment uses damper 165 so that reflected light 56 emitted from phosphor optical element 30 while maintaining high power density and rectilinearity is not emitted to the outside.

In projection device 101 according to the present embodiment, since fourth surface 44 of holder 40 and attachment portion 61a of heat dissipator 60 are in surface contact in the area of contact therebetween, the heat generated at semiconductor light-emitting device 10 and phosphor optical element 30 of light source device 1 is efficiently dissipated to heat dissipator 60 and dissipated by heat-dissipating fin 62 to the outside.

Furthermore, in projection device 101 according to the present embodiment, radiated light 91 from light source device 1 has a wide angle of radiation. Therefore, reflector 160 which changes the direction of radiation of radiated light 91 can be disposed immediately above light source device 1. Thus, it is possible for projection device 101 to efficiently use radiated light 91 from light source device 1, and it is possible to freely design reflector 160 for size and thickness reductions, etc.

Furthermore, in light source device 1, phosphor optical element 30 is disposed between semiconductor light-emitting device 10 and the reflective surface of reflector 160. As a result, out of the light that has been radiated from semiconductor light-emitting device 10 and has entered phosphor 31 by reflective surface 21a, reflected light 56 which is the light reflected by phosphor optical element 30 while maintaining rectilinearity is radiated at a large angle with respect to the normal direction to second surface 42 on which phosphor optical element 30 is disposed. Thus, projection device 101 can be designed such that reflector 160 is not irradiated with reflected light 56, without a decrease in the utilization efficiency of the radiated light from light source device 1.

In FIG. 5, the light reflected by reflector 160 travels across an extension of the optical path for the emitted light traveling from semiconductor light-emitting device 10 to optical element unit 20 (optical element 21) which is the reflective optical element. Accordingly, it is possible to inhibit the reflected light traveling from the reflective optical element, i.e., optical element unit 20, toward phosphor optical element 30, which is highly directional and propagates with high power density, from being emitted directly out of projection device 101 without being reflected by reflector 160. Specifically, the light (radiated light 91) reflected by reflector 160 travels in a direction opposite to that of reflected light 54 traveling from optical element unit 20 toward phosphor optical element 30 and then is radiated to the outside of projection device 101. Therefore, even when reflected light 54 does not impinge on phosphor optical element 30 and holder 40 as a result of a shift in the angle for attaching optical element unit 20 due to an exteriorly-applied impact or the like, reflected light 54 does not travel in the same direction as radiated light 91 which is the light radiated from reflector 160, unless reflected by reflector 160; thus, it is possible to reduce the possibility that reflected light 54 is emitted to the outside. Thus, by limiting the reflection region of reflector 160, the light that propagates with high power density from light source device 1 can be inhibited from being radiated directly out of projection device 101.

Note that in projection device 101 illustrated in FIG. 5, holder 40 is an integral structure, but even in the case where holder 40 is not an integral structure, when the projection device is configured such that the light reflected by reflector 160 travels across the extension of the optical path for the emitted light traveling from semiconductor light-emitting device 10 to optical element unit 20 (optical element 21) which is the reflective optical element, reflected light 54 which propagates with high power density is inhibited from being radiated to the outside as in the case where holder 40 is an integral structure.

Figure 6:
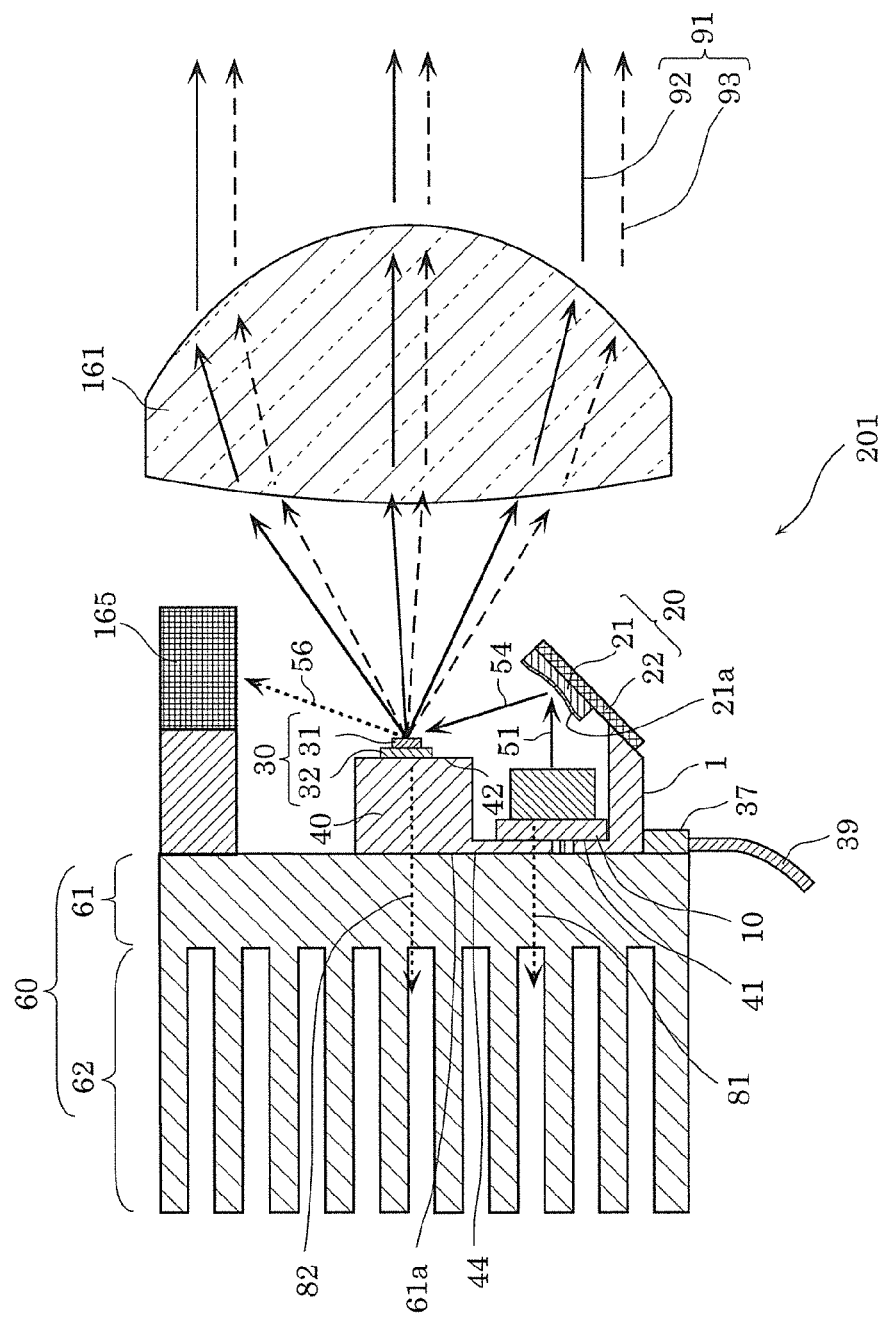
FIG. 6 is a schematic cross-sectional view illustrating another configuration of a projection device according to Embodiment 1 of the present disclosure.

Here, another configuration of the projection device including light source device 1 will be described with reference to FIG. 6. FIG. 6 is a schematic cross-sectional view illustrating a configuration of projection device 201 according to Embodiment 1 of the present disclosure.

As illustrated in FIG. 6, projection device 201 uses projection lens 161 instead of the reflector in order to project the light from light source device 1. Heat dissipator 60 includes: base plate 61 having attachment portion 61a for attaching light source device 1; and heat-dissipating fin 62 including a plurality of fins provided on a surface of base plate 61 opposite the attachment surface of attachment portion 61a. The attachment surface of attachment portion 61a is flat, for example.

Projection lens 161 is disposed immediately above light source device 1 in such a way that light-emitting point 35 of phosphor optical element 30 (phosphor 31) substantially matches the focus of projection lens 161. Radiated light 91 from light source device 1 is projected forward with the angle of radiation changed by projection lens 161.

At this time, projection device 201 illustrated in FIG. 6 can quickly exhaust the heat generated at light source device 1 as with projection device 101 illustrated in FIG. 5. Furthermore, in projection device 201, similar to projection device 101, projection lens 161 can be freely designed, and damper 165 can be used to prevent reflected light 56 from entering projection lens 161.

Note that holder 40 is an integral structure in the projection devices illustrated in FIG. 5 and FIG. 6, but even when holder 40 is not an integral structure, damper 165 can be used to prevent reflected light 56 from being emitted to the outside or entering projection lens 161.

Variation of Embodiment 1

Figure 7:
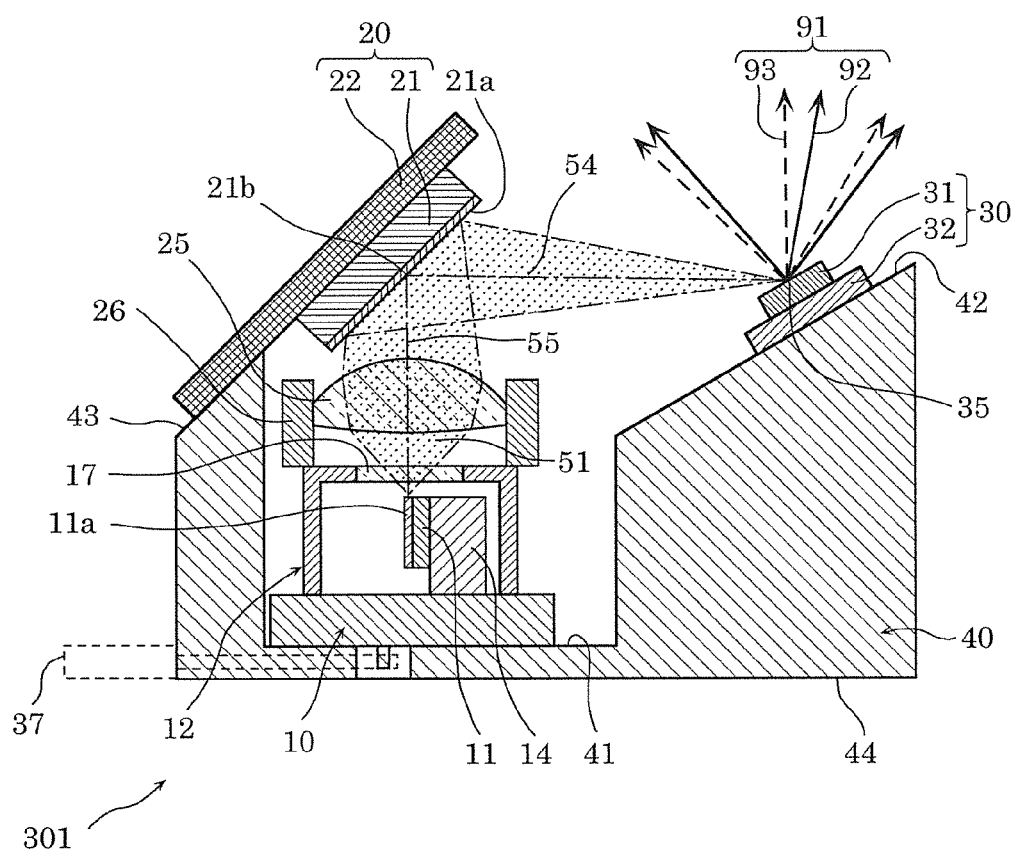
FIG. 7 is a cross-sectional view of a light source device according to a variation of Embodiment 1 of the present disclosure.

Hereinafter, a variation of Embodiment 1 of the present disclosure will be described with reference to FIG. 7. FIG. 7 is a cross-sectional view illustrating a configuration of light source device 301 according to the variation of Embodiment 1 of the present disclosure. Note that the present variation mainly describes parts different from above-described light source device 1 according to Embodiment 1 illustrated in FIG. 1.

As illustrated in FIG. 7, light source device 301 according to the present variation is different from light source device 1 illustrated in FIG. 1 in that light source device 301 according to the present variation includes lens 25 and lens holder 26, reflective surface 21a of optical element 21 is not concave, but flat, and the upper surface of phosphor 31 inclines with respect to first surface 41 of holder 40.

In the present variation, lens 25 is disposed between optical element unit 20 (optical element 21) and semiconductor light-emitting device 10. Lens 25 is a finite lens and is held on semiconductor light-emitting device 10 or holder 40 by lens holder 26. Lens 25 has a function of converging emitted light 51 from semiconductor light-emitting device 10 onto a predetermined focal point.

Optical element 21 included in optical element unit 20 is a flat reflective mirror and has flat reflective surface 21a. Specifically, optical element 21 has a configuration in which a reflective film is formed on a surface of a flat substrate. A surface of this reflective film is reflective surface 21a. As the reflective film, a multi-layer reflective film including a plurality of dielectric films having different refractive indexes, a metal film made of metal such as Ag, Au, or Cu, an alloy film made of an alloy of such metal, or the like is used.

Furthermore, in the present variation, the normal direction to second surface 42 of holder 40 inclines in the direction of optical element unit 20. Phosphor optical element 30 is fixed to second surface 42 in such a way that the surface on the phosphor holding member 32 side (the holder 40-end surface of phosphor holding member 32) contacts second surface 42. When second surface 42 inclines as just mentioned, light-emitting point 35 of phosphor 31 can be easily positioned higher than semiconductor light-emitting device 10.

As described above, with light source device 301 according to the present variation, as with light source device 1 according to Embodiment 1 described above, it is possible to reduce the occurrence of the optical path through which emitted light 51 from semiconductor light-emitting device 10 is guided to phosphor optical element 30 shifting due to changes in external environment, and it is possible to efficiently exhaust the heat generated at semiconductor light-emitting device 10 and phosphor optical element 30, and efficiently extract light out of light source device 301.

Furthermore, in the present variation, since lens 25 is disposed above semiconductor light-emitting device 10, the optical system in light source device 1 can be more freely designed.

Furthermore, in the present variation, since phosphor 31 is located higher than semiconductor light-emitting device 10, radiated light 91 which is the light radiated omnidirectionally from phosphor 31 can travel to the outside with increased efficiency.

Note that as in Embodiment 1 described above, light source device 301 according to the present variation can be used as a light source in a projection device including a reflector, etc.

Embodiment 2

Figure 8:
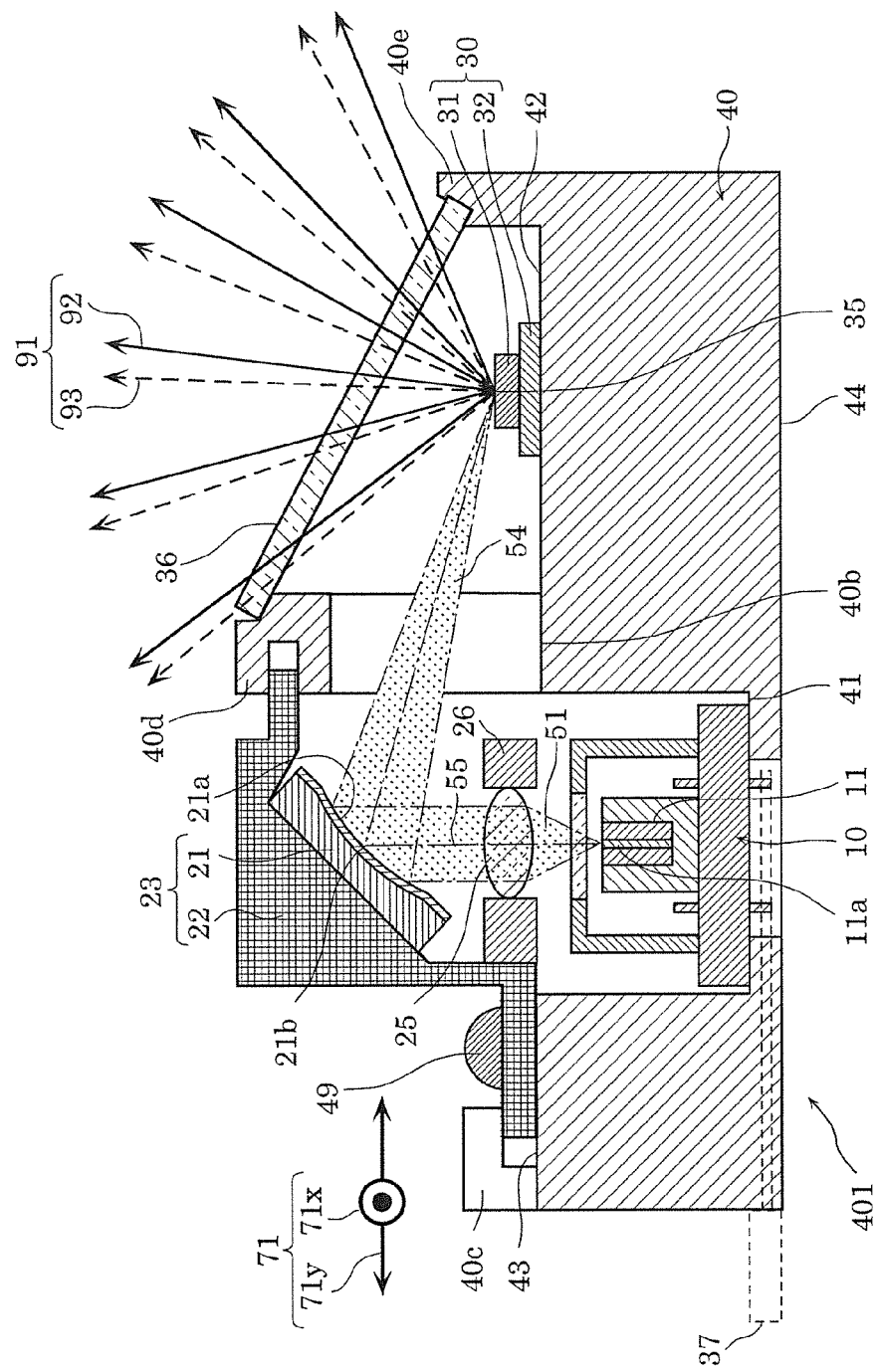
FIG. 8 is a schematic cross-sectional view illustrating a configuration of a light source device according to Embodiment 2 of the present disclosure.
Figure 9:
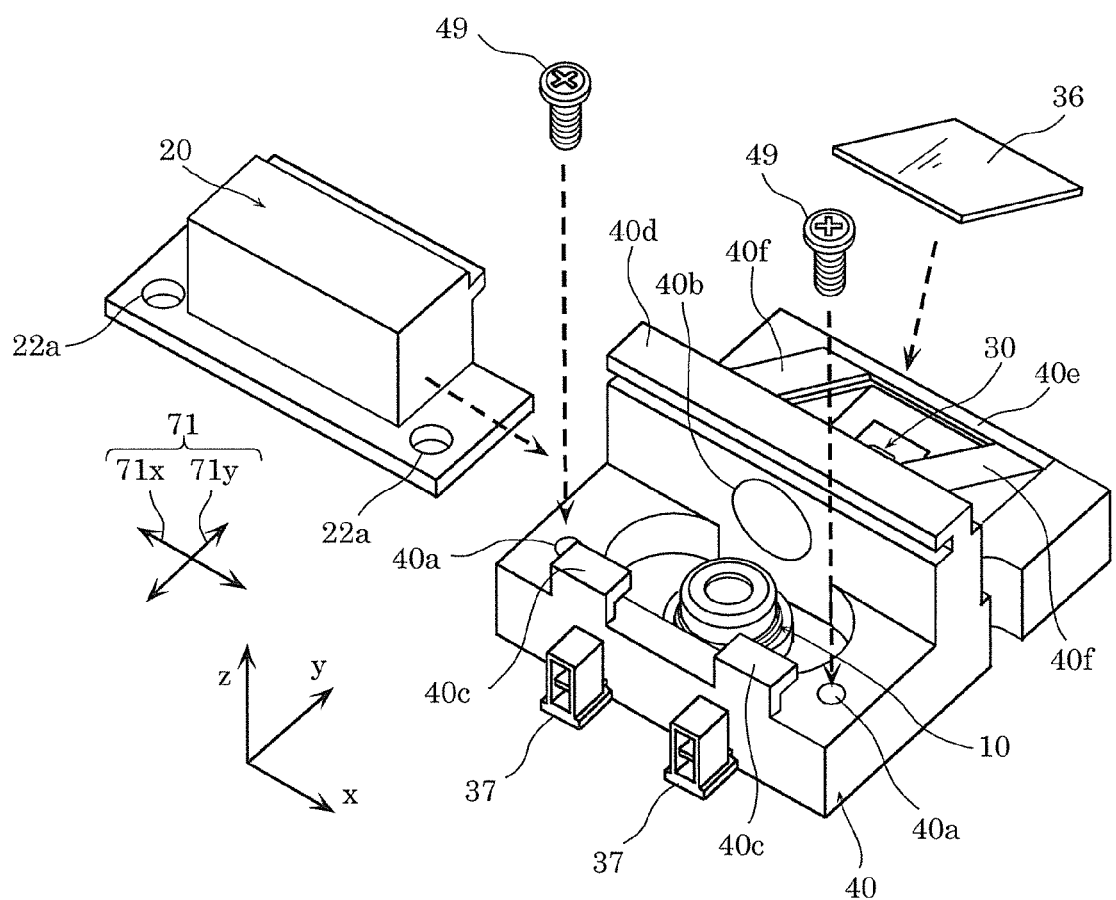
FIG. 9 is an exploded perspective view of a light source device according to Embodiment 2 of the present disclosure.

Next, light source device 401 according to Embodiment 2 of the present disclosure will be described with reference to FIG. 8 and FIG. 9. FIG. 8 is a schematic cross-sectional view illustrating a configuration of light source device 401 according to Embodiment 2 of the present disclosure. FIG. 9 is an exploded perspective view of light source device 401. Note that the present embodiment mainly describes parts different from light source device 1 according to Embodiment 1 and light source device 301 according to the variation thereof.

As illustrated in FIG. 8 and FIG. 9, light source device 401 according to the present embodiment additionally includes light-transmissive cover 36 disposed above phosphor optical element 30, compared to light source device 1 according to Embodiment 1.

Light source device 401 according to the present embodiment is different from light source device 1 according to Embodiment 1 in the method for fixing optical element unit 20 to holder 40 and in that phosphor optical element 30 is surrounded by holder 40 and light-transmissive cover 36.

Light-transmissive cover 36 is a light-transmitting cover member that covers phosphor optical element 30, and is, for example, cover glass. Light-transmissive cover 36 is held by holder 40. Specifically, light-transmissive cover 36 is held by protrusion 40d, wall 40e, and protrusion 40f of holder 40.

Light-transmissive cover 36 is disposed in such a way that the phosphor optical element 30-end surface of light-transmissive cover 36 inclines with respect to the fluorescent surface of phosphor optical element 30. Specifically, light-transmissive cover 36 is disposed in such an orientation as to approach phosphor optical element 30 in a direction from the side of semiconductor light-emitting device 10 toward phosphor optical element 30.

Phosphor optical element 30 is disposed in a closed space surrounded by holder 40 and light-transmissive cover 36. This closed space is a sealed space in order to be shielded from the ambient air, except for opening 40b of holder 40.

Optical element holding member 22 included in optical element unit 20 has an inclined surface to which optical element 21 is fixed by means of bonding or the like. Optical element holding member 22 is made of a material that is opaque for emitted light 51 such as an aluminum alloy, iron, or copper.

Furthermore, protrusions 40c and 40d are formed on holder 40. Protrusion 40c is a wall projecting from third surface 43 of holder 40. Likewise, protrusion 40d is a wall projecting from second surface 42 of holder 40. The height of protrusion 40c is greater than the height of protrusion 40d.

Protrusions 40c and 40d include a pinching portion into which a part of optical element holding member 22 is pinched. The pinching portion of protrusions 40c and 40d is structured, for example, in the form of a lateral groove. Protrusions 40c and 40d are made of the same material as holder 40, and are formed, for example, integrally with holder 40.

Note that opening 40b is formed in protrusion 40d to cause reflected light 54 which is the light reflected off reflective surface 21a of optical element unit 20 (optical element 21) to enter phosphor optical element 30. Opening 40b is, for example, a cylindrical through-hole penetrating protrusion 40d.

As illustrated in FIG. 9, optical element holding member 22 is inserted into protrusions 40c and 40d of holder 40 laterally. Furthermore, optical element holding member 22 is disposed in such a way as to be freely movable in optical element unit adjustment direction 71 (directions 71x and 71y which are the directions of the arrows in the figure and a direction orthogonal thereto), as illustrated in FIG. 8, using third surface 43 and protrusions 40c and 40d of holder 40. In other words, optical element holding member 22 is movable parallel to third surface 43.

On the other hand, the movement of optical element holding member 22 in a direction (vertical direction) different from optical element unit adjustment direction 71 is limited. Specifically, optical element holding member 22 is pinched into each of protrusions 40c and 40d of holder 40 so as not to move in a direction (vertical direction in the figure) perpendicular to third surface 43.

When the position of optical element unit 20 is adjusted through movement of optical element unit 20 in optical element unit adjustment direction 71, the position of light-emitting point 35 of phosphor optical element 30 can be adjusted. After the position of optical element unit 20 is adjusted, screw 49 can be inserted into opening 22a of optical element holding member 22 and screwed into screw hole 40a of holder 40, allowing optical element unit 20 to be fixed to holder 40.

In this manner, in the present embodiment, the position of optical element unit 20 can be finely adjusted using the pinching portion (lateral groove structure) of protrusions 40c and 40d of holder 40. Thus, the position of reflective surface 21a of optical element 21 can be accurately and easily adjusted. Furthermore, after the position of optical element unit 20 is adjusted, optical element unit 20 can be easily fixed to holder 40.

Furthermore, optical element holding member 22 is pinched into protrusions 40c and 40d of holder 40. Therefore, even when screw 49 fixing optical element holding member 22 is loosened and detached due to vibration or the like, optical element holding member 22 does not move in a direction perpendicular to third surface 43, and thus optical element unit 20 can be inhibited from falling off. As a result, even when optical element unit 20 is detached from holder 40, it is possible to reduce the occurrence of emitted light 51 from semiconductor light-emitting device 10 being directly radiated to the outside of light source device 1.

The gap between fitting portions of holder 40 and optical element holding member 22 is preferably filled with a filler material, etc., such as an epoxy resin (not illustrated in the drawings). With this configuration, optical element holding member 22 is less likely to be detached from the pinching portions of protrusions 40c and 40d. Furthermore, the filler material can inhibit exterior trash and dust from entering, through the gap between holder 40 and optical element holding member 22, the optical path through which the light radiated from semiconductor light-emitting device 10 travels to phosphor optical element 30.

Furthermore, phosphor optical element 30 is fixed to holder 40, and light-transmissive cover 36 which is, for example, cover glass, is fixed to holder 40 on the upper surface (emission direction) of phosphor optical element 30. In this case, phosphor optical element 30 is disposed in the space sealed so as to be shielded from the ambient air, except for opening 40b of holder 40.

Furthermore, light-transmissive cover 36 may incline with respect to second surface 42 of holder 40. With this, the entry direction of reflected light 54 can be greater in height than phosphor 31.

As described above, with light source device 401 according to the present embodiment, as with light source device 1 according to Embodiment 1 described above, it is possible to reduce the occurrence of the optical path through which emitted light 51 from semiconductor light-emitting device 10 is guided to phosphor optical element 30 shifting due to changes in external environment, and it is possible to efficiently exhaust the heat generated at semiconductor light-emitting device 10 and phosphor optical element 30, and efficiently extract light out of light source device 401.

Furthermore, even when an impact or the like is exteriorly applied to a product equipped with light source device 401 according to the present embodiment, it is possible to inhibit optical element unit 20 from being detached from light source device 401. Thus, it is possible to inhibit emitted light 51 (blue light) having high energy strength from semiconductor light-emitting device 10 from being directly radiated from light source device 401 as a result of optical element unit 20 being detached from light source device 401.

Furthermore, in the present embodiment, since phosphor 31 is located higher than semiconductor light-emitting device 10, radiated light 91 which is the light radiated omnidirectionally from phosphor 31 can travel to the outside with increased efficiency.

Furthermore, in light source device 401, semiconductor light-emitting device 10 and phosphor optical element 30 are disposed in the closed space, and thus it is possible to inhibit a reduction in the efficiency of the optical components by collecting exterior trash and dust through optical tweezing using the emitted light having high light density. In particular, the deterioration of semiconductor light-emitting element 11 and phosphor 31 can be suppressed.

Figure 10A:
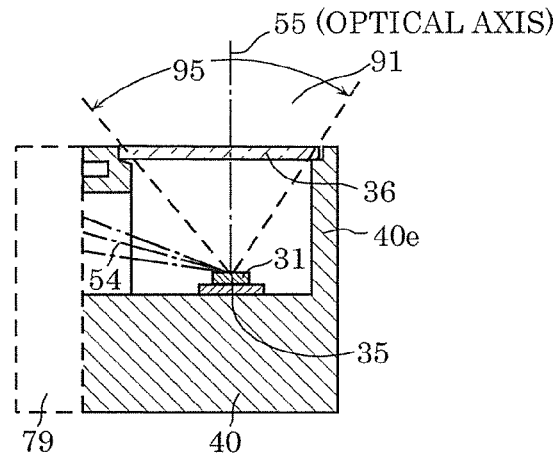
FIG. 10A illustrates an advantage of a light source device according to Embodiment 2 of the present disclosure.
Figure 10B:
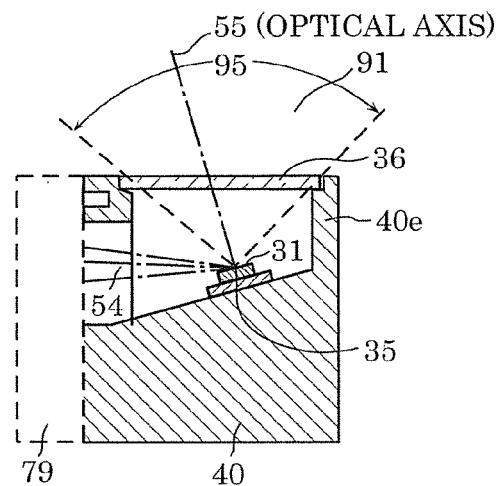
FIG. 10B illustrates an advantage of a light source device according to Embodiment 2 of the present disclosure.
Figure 10C:
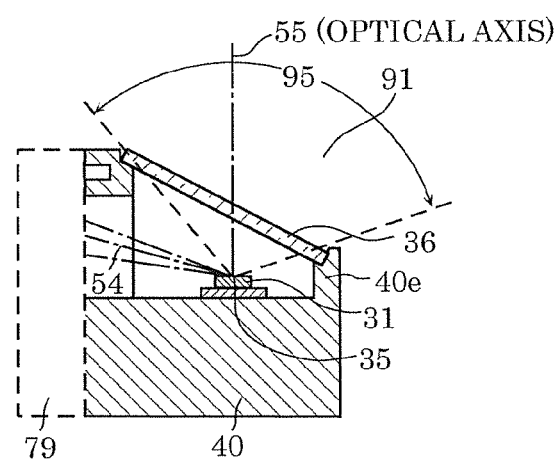
FIG. 10C illustrates an advantage of a light source device according to Embodiment 2 of the present disclosure.

Furthermore, in the present embodiment, light-transmissive cover 36 is disposed at an angle with respect to the fluorescent surface (surface) of phosphor 31. Here, the relationship between the inclination of light-transmissive cover 36 and radiation range 95 and the strength of radiated light 91 from light source device 401 will be described with reference to FIG. 10A, FIG. 10B, and FIG. 10C. FIG. 10A to FIG. 10C illustrate an advantage of the light source device according to Embodiment 2 of the present disclosure, giving enlarged views of a part of light source device 401 according to Embodiment 2 for comparison.

FIG. 10A illustrates the case where light-transmissive cover 36 is disposed parallel to the fluorescent surface (surface) of phosphor 31. In FIG. 10A, reflected light 54 traveling toward phosphor 31 is radiated diagonally downward from laser reflective optical system 79 including semiconductor light-emitting device 10 and optical element unit 20 having reflective surface 21a. In this case, part of radiated light 91 from phosphor 31 is blocked by an upper portion of laser reflective optical system 79.

Thus, as illustrated in FIG. 10A, when light-transmissive cover 36 is disposed parallel to phosphor 31, wall 40e for light-transmissive cover 36 needs to be formed on holder 40 up to substantially the same height as laser reflective optical system 79. As a result, radiated light 91 is blocked on the wall 40e-side, as on the laser reflective optical system 79-side, and thus radiation range 95 of radiated light 91 is narrow. At this time, in order to widen radiation range 95, wall 40e can be disposed away from phosphor 31, but light source device 401 will increase in size.

Meanwhile, as illustrated in FIG. 10B, an inclined surface can be formed on holder 40, and phosphor 31 can be attached to the inclined surface so that reflected light 54 is radiated laterally. Accordingly, the effective height of wall 40e can be lowered, and thus radiation range 95 of radiated light 91 can be widened. In this case, optical axis 55 of radiated light 91 inclines as a result of the fluorescent surface of phosphor 31 inclining along the inclined surface of holder 40, but it is possible to increase the utilization efficiency of radiated light 91 by adjusting the optical system located downstream (on the emission side) of light source device 401. In this manner, when light-transmissive cover 36 is disposed at an angle with respect to the fluorescent surface (surface) of phosphor 31, radiation range 95 of radiated light 91 is widened, and the strength of radiated light from light source device 401 increases.

Furthermore, as illustrated in FIG. 10C, when light-transmissive cover 36 is disposed diagonally with respect to phosphor 31 and holder 40, the same advantageous effects achieved as in FIG. 10B can be achieved. In this case, with the configuration in FIG. 10C, the adjustment of the optical system located downstream (on the emission side) of light source device 401, which is required in the configuration in FIG. 10B, is no longer needed; thus, it is possible to increase the strength of radiated light of light source device 401 using a simple method.

Note that as illustrated in FIG. 8, in light source device 401 according to the present embodiment, the orientation of semiconductor light-emitting element 11 is different form the orientation of semiconductor light-emitting element 11 in light source device 1 illustrated in FIG. 1, but the orientation of semiconductor light-emitting element 11 may be any of the orientation illustrated in FIG. 8 and the orientation illustrated in FIG. 1. Semiconductor light-emitting element 11 is preferably disposed so as to be oriented as in FIG. 8. The orientation illustrated in FIG. 8 is an orientation in which a normal to reflective surface 21a at principal point 21b is present in a plane parallel to a plane in which optical waveguide 11a of semiconductor light-emitting element 11 is formed With the orientation illustrated in FIG. 8, the spread angle of the emitted light in direction 71y becomes smaller than the spread angle of the emitted light in direction 71x, and thus it is possible to reduce the width of optical element 21 in direction 71y. Accordingly, the heights of optical element holding member 22 and protrusion 40c from second surface 42 can be reduced. As a result, radiation range 95 of radiated light 91 from phosphor 31 can be widened.

Variation of Embodiment 2

Figure 11:
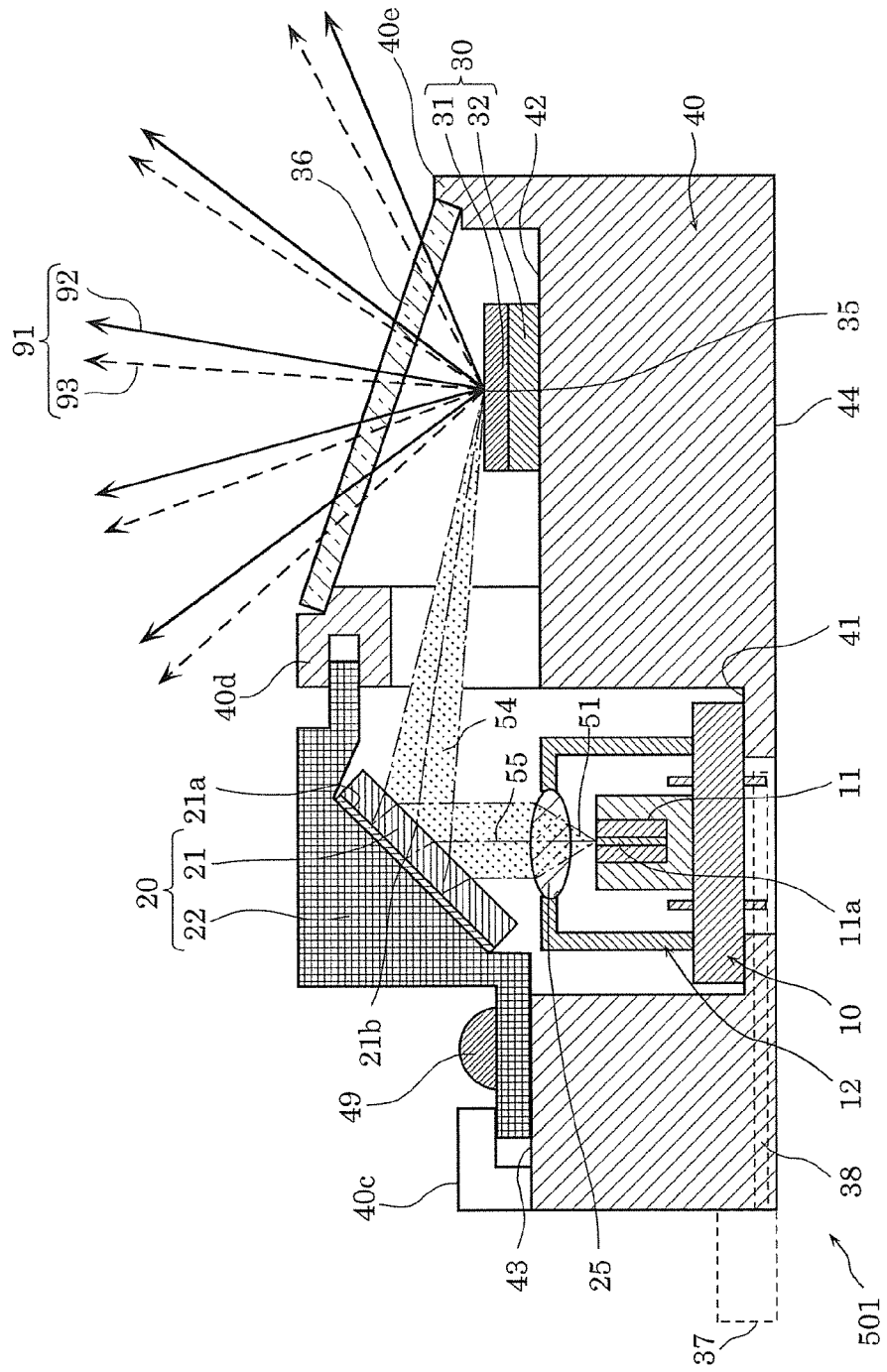
FIG. 11 is a schematic cross-sectional view illustrating a configuration of a light source device according to a variation of Embodiment 2 of the present disclosure.

Hereinafter, a variation of Embodiment 2 of the present disclosure will be described with reference to FIG. 11. FIG. 11 is a schematic cross-sectional view illustrating a configuration of light source device 501 according to a variation of Embodiment 2 of the present disclosure. Note that the present variation mainly describes parts different from light source device 401 according to Embodiment 2.

As illustrated in FIG. 11, in light source device 501 according to the present variation, in the portion in which windowpane 17 for cap 16 of semiconductor light-emitting device 10 is disposed in light source device 401 according to Embodiment 2, lens 25 is disposed instead of windowpane 17 as a light-transmissive member. Lens 25 is, for example, a convex lens. Lens 25 is fixed to cap 16 by glass-welding or the like so that the space in which semiconductor light-emitting element 11 of semiconductor light-emitting device 10 is disposed is sealed off and remains airtight.

Optical element 21 included in optical element unit 20 includes a reflective Fresnel lens on the attachment surface-side (optical element holding member 22 side), and a reflective film such as a metal film or a dielectric multi-layer film is formed on the attachment surface-end surface of the Fresnel lens. Furthermore, an antireflection film including a dielectric multi-layer film is formed on the entry surface facing the Fresnel lens. A surface of the reflective film (that is, the interface between the Fresnel lens and the reflective film) is reflective surface 21a. With this, emitted light 51 from lens 25 of semiconductor light-emitting device 10 enters the surface of optical element 21, passes through the Fresnel lens, is reflected off reflective surface 21a, thereby is converted into converging light, and passes through the Fresnel lens again before exiting optical element 21 as reflected light 54.

As described above, with light source device 501 according to the present variation, as with light source device 401 according to Embodiment 2 described above, it is possible to reduce the occurrence of the optical path through which emitted light 51 from semiconductor light-emitting device 10 is guided to phosphor optical element 30 shifting due to changes in external environment, and it is possible to efficiently exhaust the heat generated at semiconductor light-emitting device 10 and phosphor optical element 30, and efficiently extract light out of light source device 501.

Furthermore, in the present variation, since phosphor 31 is located higher than semiconductor light-emitting device 10, radiated light 91 which is the light radiated omnidirectionally from phosphor 31 can travel to the outside with increased efficiency.

Furthermore, in the present variation, the distance between semiconductor light-emitting device 10 and optical element unit 20 (optical element 21) can be reduced, and the thickness of optical element 21 can also be reduced. Accordingly, the height of light source device 501 can be small.

Embodiment 3

Next, a light source device according to Embodiment 3 of the present disclosure and a projection device including the same will be described.

Figure 12:
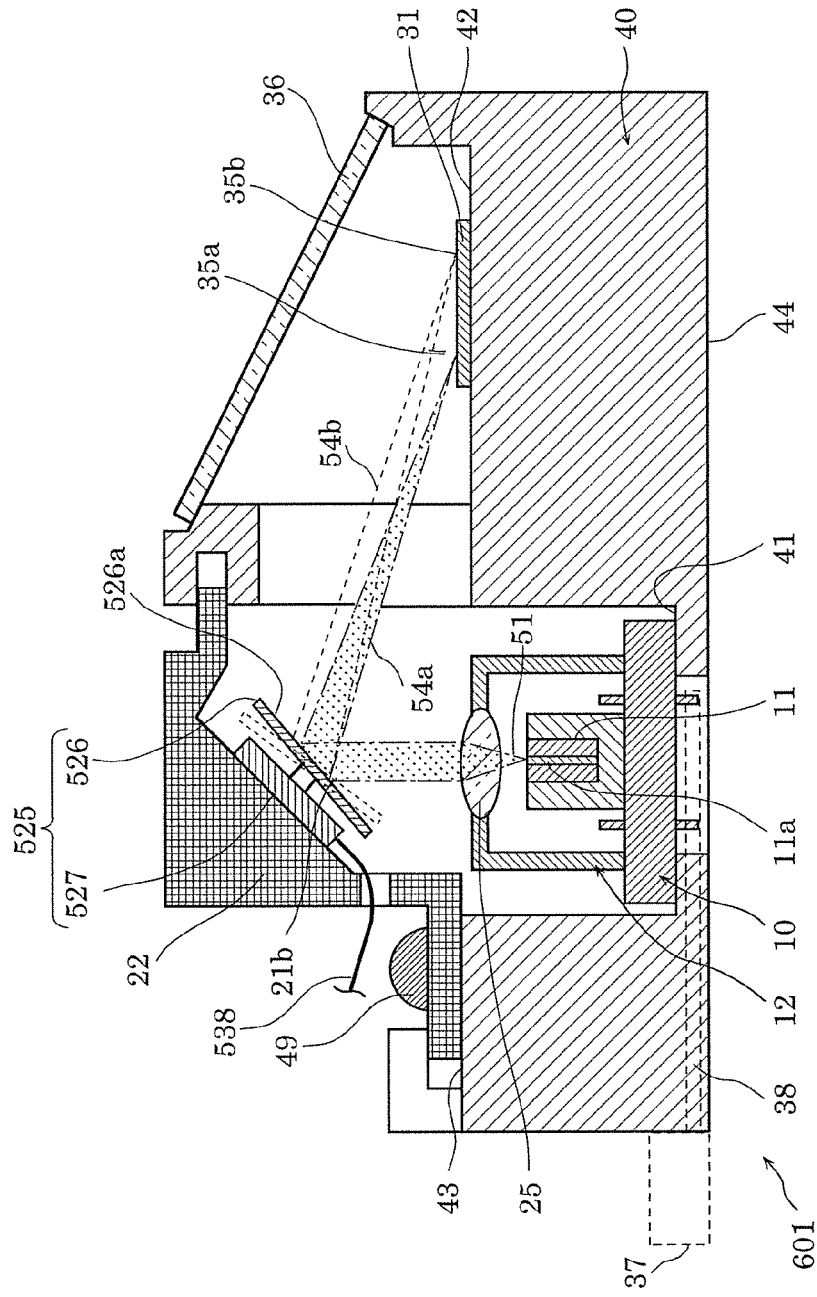
FIG. 12 is a schematic cross-sectional view illustrating a configuration of a light source device according to Embodiment 3 of the present disclosure.
Figure 13:
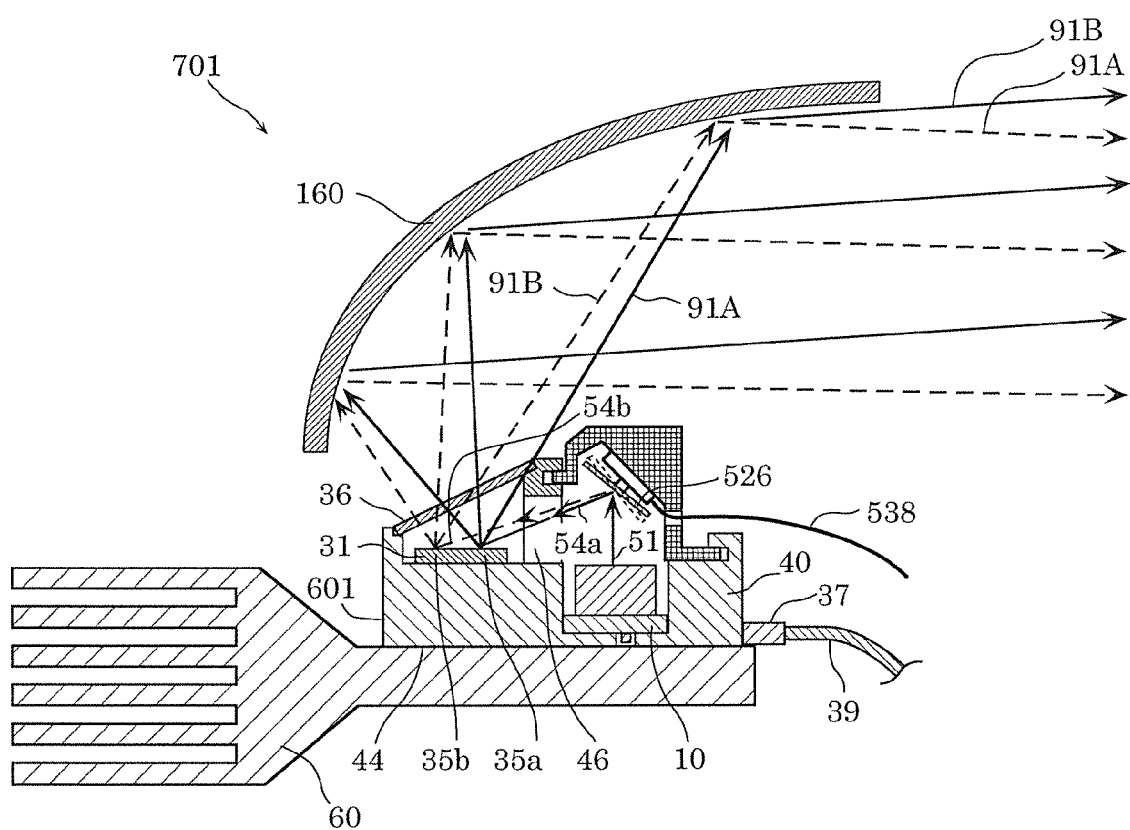
FIG. 13 is a schematic cross-sectional view illustrating a configuration of a projection device including a light source device according to Embodiment 3 of the present disclosure.

FIG. 12 is a schematic cross-sectional view illustrating a configuration of light source device 601 according to Embodiment 3 of the present disclosure. FIG. 13 is a schematic cross-sectional view illustrating a configuration of projection device 701 including light source device 601.

The present embodiment is characterized in that the emission direction of emitted light from projection device 701 can be arbitrarily changed by moving the light-emitting point of light source device 601.

As illustrated in FIG. 12, light source device 601 according to the present embodiment is configured in such a way that optical element 526 (reflector element) included in optical element unit 525 is movable. Specifically, optical element unit 525 includes optical element 526 having movable reflective surface 526a. Optical element unit 525 is, for example, a micro-electro-mechanical systems (MEMS) mirror element, and is configured to include a finely movable shaft and optical element 526 on drive substrate 527.

Drive substrate 527 is supplied with power through wire 538, and changing optical element 526 with electrostatic force, magnetic force, and the like causes a change in the inclination direction of reflective surface 526a. As a result, emitted light 51 from lens 25 is arbitrarily redirected and reflected off reflective surface 526a, and then irradiates phosphor 31. In other words, when optical element 21 changes, the direction of travel of reflected light 54 is changed.

At this time, for example, when optical element 526 is present in the position indicated by the solid line, light is reflected as reflected light 54a and irradiates a semiconductor light-emitting device 10-end surface of phosphor 31, and radiated light 91A is output from light-emitting point 35a. In contrast, when optical element 526 is present in the position indicated by the dashed line, light is reflected as reflected light 54b and irradiates the surface of phosphor 31, in a position away from semiconductor light-emitting device 10, and radiated light 91B is output from light-emitting point 35b.

In this manner, with light source device 601 illustrated in FIG. 12, the position of the light-emitting point in phosphor optical element 30 can further be freely changed, compared to light source device 501 illustrated in FIG. 11. Thus, when a projection device is formed using light source device 601 illustrated in FIG. 12, it is possible to freely change the light irradiation position.

Specifically, FIG. 13 illustrates a schematic cross-sectional view of projection device 701 including light source device 601.

In projection device 701, heat-dissipating surface 44 is attached to heat dissipator 60, and reflector 160 which is, for example, a parabolic mirror is disposed on the light-transmissive cover 36-side.

At this time, light source device 601 is disposed in such a way that semiconductor light-emitting device 10 is located in the emission direction of reflector 160 and phosphor 31 is located opposite thereto. With this configuration, the direction of travel of reflected light 54a and 54b from optical element 526 toward phosphor 31 can be set opposite to the direction of travel of light radiated from reflector 160.

Furthermore, radiated light 91A output from light-emitting point 35a as a result of reflected light 54a irradiating light-emitting point 35a is reflected by reflector 160, resulting in substantially parallel white light which is emitted to the outside of projection device 701.

In contrast, also when the angle of inclination of optical element 526 is changed and reflected light 54b irradiates light-emitting point 35b, radiated light 91B output from light-emitting point 35b is reflected by reflector 160, resulting in substantially parallel white light which is emitted to the outside of projection device 701. At this time, radiated light 91A and radiated light 91B which are emitted from projection device 701 exit at different emission angles. Thus, it is possible to provide projection device 701 which is capable of changing the emission direction of light exiting from projection device 701 by applying power to optical element unit 525 (FIG. 12) to change the position of optical element unit 525.

Light source device 601 according to the present embodiment can be used, for example, in a projection device for vehicle headlight use. In this case, it is possible to implement an adaptive driving beam (ADB) headlamp or the like as projection device 701.

Note that although optical element unit 525 is the MEMS in the present embodiment, this is not limiting. For example, it is possible to arbitrarily select an optical element unit which moves optical element 526 using electrostatic force or magnetic force. Furthermore, for example, using a digital micromirror device (DMD) which is a two-dimensional MEMS mirror array as optical element unit 525, the light-emitting point on phosphor 31 can be an arbitrary two-dimensional pattern.

Embodiment 4

Figure 14:
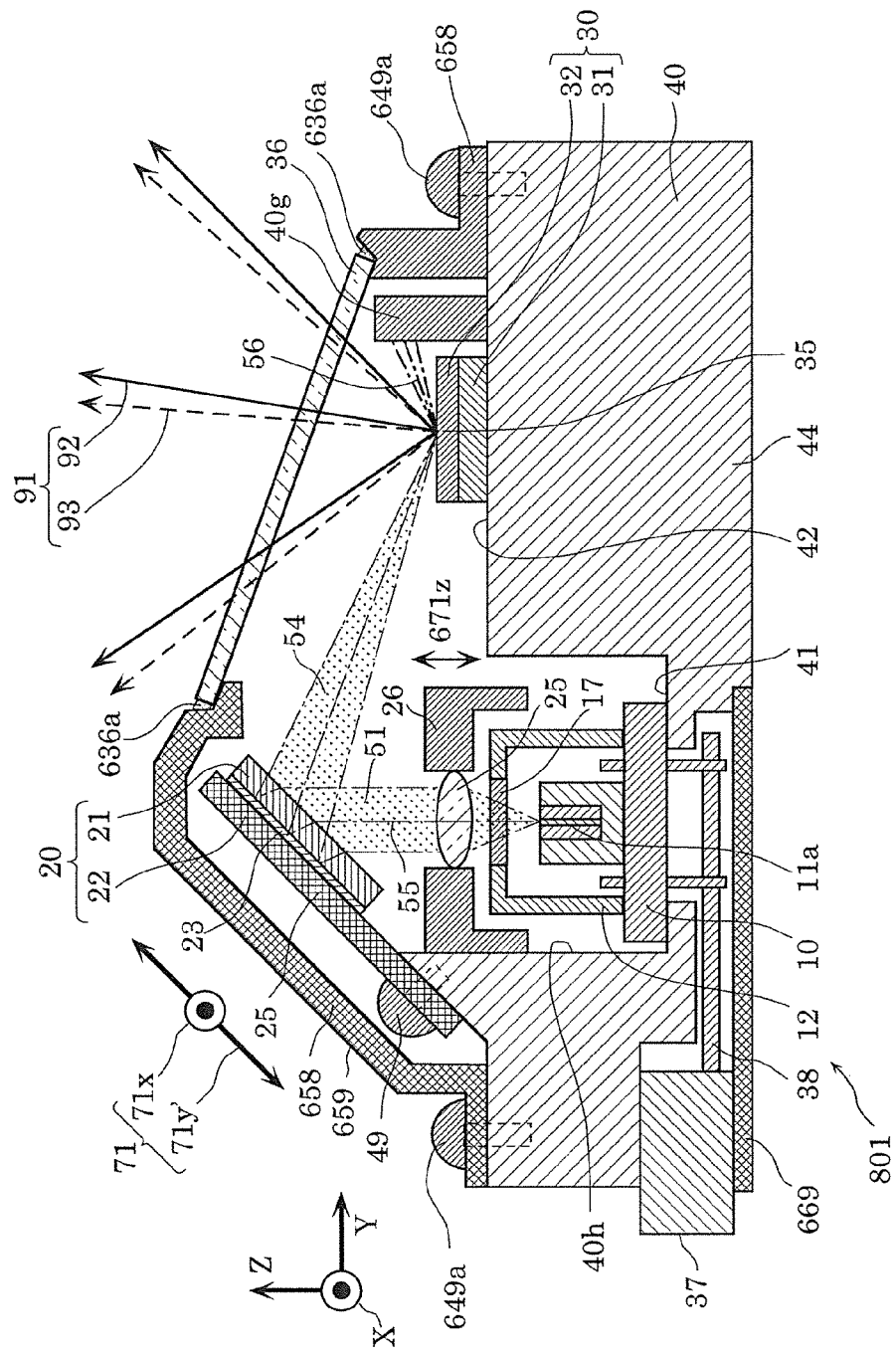
FIG. 14 is a schematic cross-sectional view illustrating a configuration of a light source device according to Embodiment 4 of the present disclosure.
Figure 15:
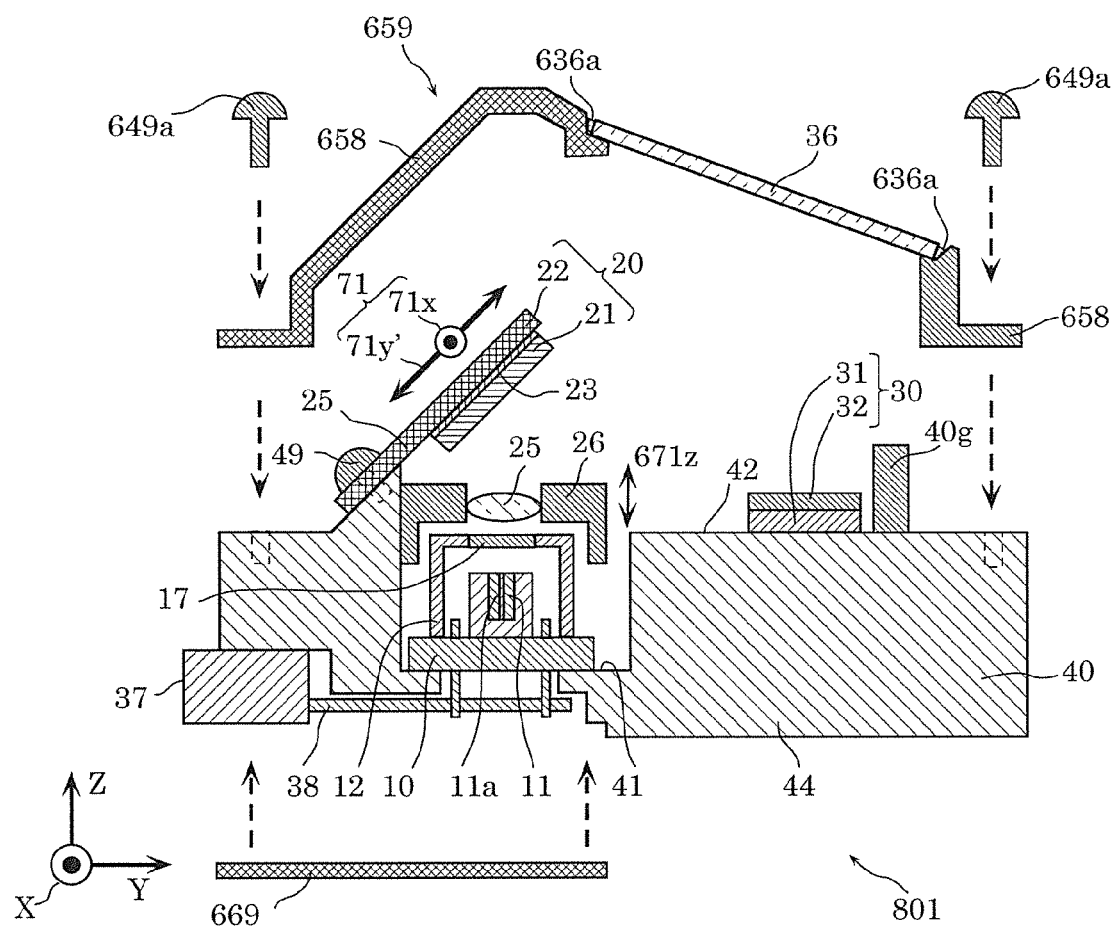
FIG. 15 is a schematic cross-sectional view illustrating a method for manufacturing a light source device according to Embodiment 4 of the present disclosure.
Figure 16:
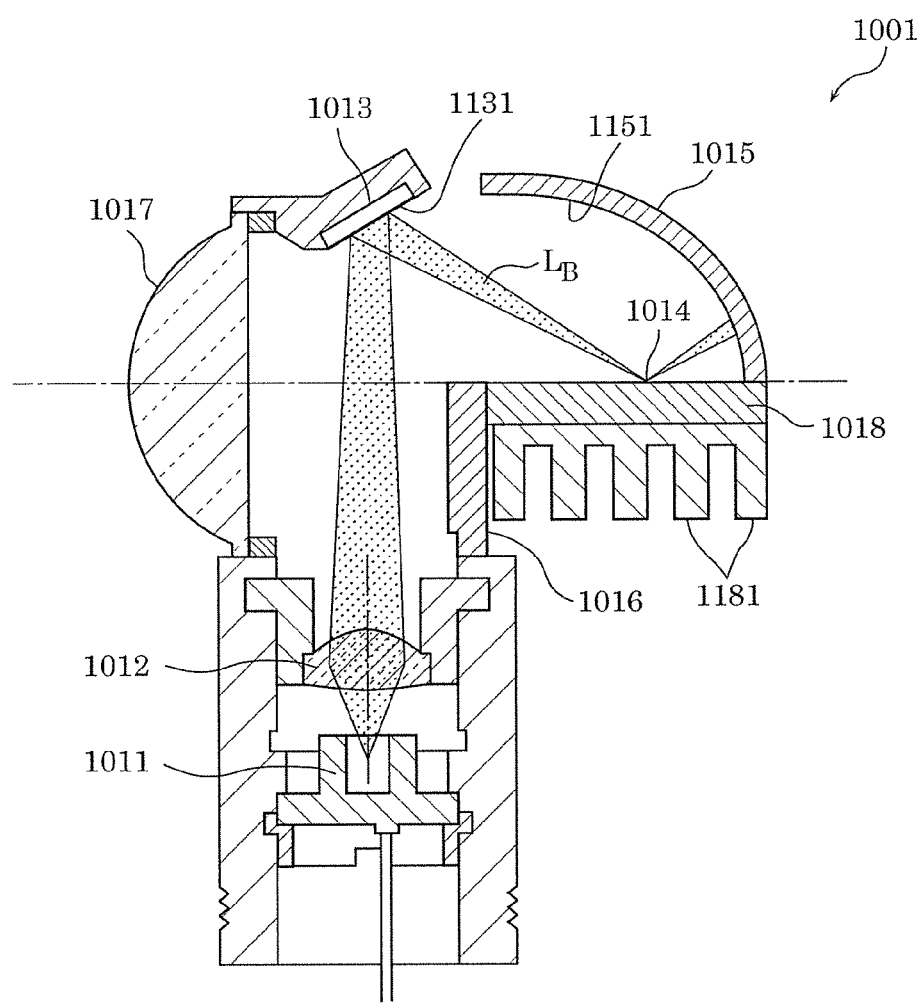
FIG. 16 is a cross-sectional view illustrating a configuration of a conventional light source device.

Next, Embodiment 4 of the present disclosure will be described with reference to FIG. 14 and FIG. 15. FIG. 14 is a schematic cross-sectional view illustrating a configuration of light source device 801 according to Embodiment 4 of the present disclosure. FIG. 15 is a schematic cross-sectional view illustrating a method for manufacturing light source device 801 according to Embodiment 4 of the present disclosure.

Note that the present embodiment mainly describes parts different from light source device 501 according to the variation of Embodiment 2.

As illustrated in FIG. 14, in light source device 801 according to the present embodiment, lens 25 in light source device 501 according to the variation of Embodiment 2 is fixed to lens holder 26, as in light source device 401.

Semiconductor light-emitting device 10 is disposed on first surface 41 which is the bottom surface of a recess provided in a part of holder 40. In other words, the surrounding parts of first surface 41 on which semiconductor light-emitting device 10 is disposed have a greater height than first surface 41. Specifically, side surface 40h is provided as a part having a greater height than first surface 41.

Lens holder 26 is fixed to a part of side surface 40h provided around first surface 41. At this time, lens holder 26 is partially or entirely disposed in the recess of holder 40.

With this configuration, it is possible to limit the region in which semiconductor light-emitting device 10 and lens holder 26 are disposed, and thus semiconductor light-emitting device 10 and lens holder 26 can be easily disposed in predetermined positions in the recess having first surface 41.

At this time, lens holder 26 is adjusted along lens holder adjustment direction 671z which is the direction of optical axis 55 from optical waveguide 11a to optical element 20 (the vertical direction in FIG. 14), and thus is fixed to side surface 40h.

Note that lens holder 26 may be fixed to any of the side surfaces of holder 40 within the recess, i.e., the side surface on the side on which phosphor 31 is disposed, the side surface opposite thereto, and the side surface at a right angle therewith. Furthermore, lens holder 26 is preferably fixed with a screw, as with optical element holding member 22. Specifically, a through-hole is provided in a part of holder 40, a screw is inserted thereto in the X direction in FIG. 14, lens holder 26 is pressed against side surface 40h, and thus lens holder 26 can be easily fixed to holder 40.

Furthermore, in the present embodiment, as in FIG. 1 according to Embodiment 1, optical element unit 20 is moved in directions 71x and 71y' of the inclined surface, and thus positioned and fixed with screw 49. With this, emitted light 51 generated at optical waveguide 11a can be adjusted in the X direction and the Y direction with respect to a predetermined position on phosphor 31 and also in the direction of the optical axis of reflected light 54. Thus, it is possible to not only accurately set the position of light-emitting point 35 to a predetermined position, but also control the light density of reflected light 54 at light-emitting point 35. In addition, all optical elements for adjusting emitted light 51 can be firmly fixed using screws.

Furthermore, in the present embodiment, protrusion 40g is provided on second surface 42 near the position in which phosphor 31 is disposed. Protrusion 40g is irradiated with reflected light 56 which propagates with its directionality unchanged, out of reflected light 54 reflected off the surface of phosphor 31. Thus, when protrusion 40g is provided, reflected light 56, i.e., part of reflected light 54 which is reflected off the surface of phosphor 31 with its directionality unchanged and propagates can be easily blocked using a part of holder 40.

Furthermore, in the present embodiment, light-transmissive cover unit 659 including light-transmissive cover holder 658 and transparent cover 36 is disposed on the first surface 41-side and the second surface 42-side of holder 40. Here, light-transmissive cover 36 which is, for example, glass having an antireflection film formed on a surface is fixed to light-transmissive cover holder 658 which is, for example, an aluminum alloy using bonding member 636a which is, for example, a thermosetting resin. With light-transmissive cover unit 659 and holder 40, it is possible to seal off the optical path through which emitted light 51 from optical waveguide 11a travels to phosphor 31. Light-transmissive cover unit 659 is used as a sealing member separate from a movable component for position adjustment. Therefore, by using light-transmissive cover unit 659, it is possible to easily seal off the optical path through which emitted light 51 from optical waveguide 11a travels to phosphor 31. Note that, as illustrated in FIG. 15, for example, light-transmissive cover unit 659 is firmly fixed to holder 40 with screws 649a.

Furthermore, in the present embodiment, cover member 669 made of an aluminum alloy, plastic, or the like is disposed on the fourth surface 44-side of holder 40. Cover member 669 covers wire 38.

Specifically, a waterproof connector is used as connector 37, and connector 37, holder 40, and cover member 669 seal wire 38. With this configuration, it is possible to prevent a wire short circuit or the like that is due to a piece of metal, salty water, etc., entering from the outside and adhering to wire 38.

Other Variations

Although the light source device and the projection device according to the present disclosure have been described based on the above embodiments and variations, the present disclosure is not limited to the above embodiments and variations. For example, forms obtained by various modifications to the above-described embodiments and variations that can be conceived by a person of skill in the art as well as forms realized by arbitrarily combining structural elements and functions in the embodiments and variations without departing from the subject matter of the present disclosure are included in the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

With the present disclosure, the Joule heat generated at the semiconductor light-emitting element and the phosphor can be easily dissipated, leading to improvement in durability; thus, the present disclosure can be widely used as various optical devices such as a light source device including a semiconductor light-emitting element and a phosphor, and a projection device including the light source device.

What is claimed is:

1. A light source device, comprising:
   a holder having a first surface and a second surface and being an integral structure, the second surface being located higher than the first surface;
   a semiconductor light-emitting device on the first surface;
   a reflective optical element above the semiconductor light-emitting device, the reflective optical element having a reflective surface that inclines with respect to the first surface and reflects emitted light from the semiconductor light-emitting device;
   a phosphor optical element on the second surface, the phosphor optical element being irradiated with reflected light from the reflective optical element, and
   a light-transmissive cover above the phosphor optical element,
   wherein the reflective optical element includes:
      a holding member on a third surface of the holder, the holding member being opaque; and
      a reflector element having the reflective surface and fixed to a surface of the holding member that faces the semiconductor light-emitting device, and
   wherein the semiconductor light-emitting device and the phosphor optical element are disposed in a closed space surrounded by the holder, the holding member, and the light-transmissive cover.

2. The light source device according to claim 1, wherein a surface of the holder opposite the first surface is a first heat-dissipating surface that dissipates heat generated at the semiconductor light-emitting device, and
   a surface of the holder opposite the second surface is a second heat-dissipating surface that dissipates heat generated at the phosphor optical element.

3. The light source device according to claim 2, wherein the first heat-dissipating surface and the second heat-dissipating surface are flush.

4. The light source device according to claim 1, wherein the holder is an integral heat dissipator.

5. The light source device according to claim 4, wherein the holder includes a metal.

6. The light source device according to claim 1, wherein the semiconductor light-emitting device includes:
   a base thermally connected to the first surface of the holder;
   a semiconductor light-emitting element that is thermally connected to the base and radiates the emitted light; and
   a cap on the base, the cap including a light-transmissive member that transmits the emitted light, and
   a sealed space is defined inside the semiconductor light-emitting device.

7. The light source device according to claim 6, wherein the light-transmissive member is sheet glass.

8. The light source device according to claim 6, wherein the light-transmissive member is a lens.

9. The light source device according to claim 6, wherein the reflective surface is shaped to converge the reflected light.

10. The light source device according to claim 1, wherein the holder includes a pinching portion that pinches a part of the holding member, and
    the holding member is movable parallel to the third surface.

11. The light source device according to claim 1, wherein a surface of the light-transmissive cover that faces the phosphor optical element inclines with respect to a fluorescent surface of the phosphor optical element.

12. The light source device according to claim 1, further comprising:
    a lens between the reflective optical element and the semiconductor light-emitting device.

13. The light source device according to claim 1, wherein the holder includes a recess, and
    the first surface is a bottom surface of the recess.

14. A projection device, comprising:
    a light source device according to claim 1.

15. The projection device according to claim 14, further comprising:

a reflector that reflects light emitted from the light source device.

16. The projection device according to claim 15, further comprising:
a damper that absorbs or diffuses light emitted from the light source device that fails to strike the reflector.

17. The projection device according to claim 15, wherein the light reflected by the reflector travels across an extension of an optical path through which the emitted light travels from the semiconductor light-emitting device to the reflective optical element.

18. A projection device, comprising:
a light source device; and
a reflector that reflects light emitted from the light source device,
wherein the light source device comprises:
a holder having a first surface and a second surface and being an integral structure, the second surface being located higher than the first surface;
a semiconductor light-emitting device on the first surface;
a reflective optical element above the semiconductor light-emitting device, the reflective optical element having a reflective surface that inclines with respect to the first surface and reflects emitted light from the semiconductor light-emitting device; and
a phosphor optical element on the second surface, the phosphor optical element being irradiated with reflected light from the reflective optical element, and
the light reflected by the reflector travels across an extension of an optical path through which the emitted light travels from the semiconductor light-emitting device to the reflective optical element, and does not travel through the optical path through which the emitted light travels from the semiconductor light-emitting device to the reflective optical element.

* * * * *